(12) United States Patent
Watanabe

(10) Patent No.: US 11,195,971 B2
(45) Date of Patent: Dec. 7, 2021

(54) GLASS WIRING SUBSTRATE, METHOD OF PRODUCING THE SAME, PART-MOUNTED GLASS WIRING SUBSTRATE, METHOD OF PRODUCING THE SAME, AND DISPLAY APPARATUS SUBSTRATE

(71) Applicant: SONY CORPORATION, Tokyo (JP)

(72) Inventor: Toshihiko Watanabe, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/996,306

(22) Filed: Aug. 18, 2020

(65) Prior Publication Data

US 2020/0381587 A1 Dec. 3, 2020

Related U.S. Application Data

(63) Continuation of application No. 16/081,626, filed as application No. PCT/JP2017/004573 on Feb. 8, 2017, now Pat. No. 10,784,403.

(30) Foreign Application Priority Data

Mar. 15, 2016 (JP) .............................. JP2016-050473

(51) Int. Cl.
*H01L 23/04* (2006.01)
*H01L 23/48* (2006.01)
(Continued)

(52) U.S. Cl.
CPC .............. *H01L 33/20* (2013.01); *H01L 27/12* (2013.01); *H01L 27/156* (2013.01); *H01L 33/62* (2013.01);
(Continued)

(58) Field of Classification Search
CPC ............. H01L 21/486; H01L 23/49816; H01L 23/5383; H01L 23/5384; H05K 1/0271; H05K 1/115
See application file for complete search history.

(56) References Cited

U.S. PATENT DOCUMENTS

2002/0180027 A1 12/2002 Yamaguchi et al.
2004/0238941 A1* 12/2004 Satoh .................... H05K 1/162
257/698
(Continued)

FOREIGN PATENT DOCUMENTS

JP 2009-037164 A 2/2009
JP 2009-059883 A 3/2009
(Continued)

OTHER PUBLICATIONS

International Search Report and Written Opinion of PCT Application No. PCT/JP2017/004573, dated Apr. 11, 2017, 06 pages of English Translation and 06 pages of ISRWO.
(Continued)

*Primary Examiner* — Brian Turner
(74) *Attorney, Agent, or Firm* — Chip Law Group

(57) ABSTRACT

A glass wiring substrate includes a glass substrate, a first wiring portion formed on a first surface of the glass substrate, a second wiring portion formed on a second surface opposite to the first surface, a through-hole formed in a region of the glass substrate in which the first wiring portion and the second wiring portion are not formed, the through-hole having a diameter on a second surface side larger than a diameter on a first surface side, and a through-hole portion formed in the through-hole, one end portion of the through-hole portion extending to the first wiring portion, the other
(Continued)

end portion of the through-hole portion extending to the second wiring portion, in which a wiring pitch $P_1$ of the first wiring portion in the vicinity of the through-hole portion is narrower than a wiring pitch $P_2$ of the second wiring portion in the vicinity of the through-hole portion.

8 Claims, 11 Drawing Sheets

(51) Int. Cl.

| | | |
|---|---|---|
| *H05K 7/00* | (2006.01) | |
| *H01L 33/20* | (2010.01) | |
| *H01L 33/62* | (2010.01) | |
| *H05K 3/18* | (2006.01) | |
| *H05K 3/42* | (2006.01) | |
| *H05K 1/02* | (2006.01) | |
| *H05K 1/18* | (2006.01) | |
| *H05K 3/14* | (2006.01) | |
| *H05K 1/11* | (2006.01) | |
| *H01L 27/12* | (2006.01) | |
| *H01L 27/15* | (2006.01) | |

(52) U.S. Cl.
CPC ............... *H05K 1/02* (2013.01); *H05K 1/11* (2013.01); *H05K 1/18* (2013.01); *H05K 1/181* (2013.01); *H05K 3/14* (2013.01); *H05K 3/146* (2013.01); *H05K 3/18* (2013.01); *H05K 3/42* (2013.01); *H05K 2201/10106* (2013.01)

(56) References Cited

U.S. PATENT DOCUMENTS

| | | |
|---|---|---|
| 2006/0263003 A1 | 11/2006 | Asai et al. |
| 2009/0002958 A1 | 1/2009 | Li et al. |
| 2010/0072469 A1* | 3/2010 | Yamazaki ........... H01L 27/1225 257/43 |
| 2010/0079050 A1* | 4/2010 | Kamamori .............. H01L 33/62 313/113 |
| 2015/0124455 A1* | 5/2015 | Tamura ................ F21V 19/002 362/293 |
| 2016/0007460 A1 | 1/2016 | Shimizu et al. |
| 2016/0282684 A1* | 9/2016 | Nakamura ........ H01L 29/78633 |

FOREIGN PATENT DOCUMENTS

| | | |
|---|---|---|
| JP | 2012-074451 A | 4/2012 |
| JP | 2012-227293 A | 11/2012 |
| JP | 2015-185820 A | 10/2015 |
| WO | 2012/144493 A1 | 10/2012 |

OTHER PUBLICATIONS

International Search Report and Written Opinion of PCT Application No. PCT/JP2017/004571, dated Mar. 21, 2017, 06 pages of English Translation and 06 pages of ISRWO.

International Preliminary Report on Patentability of PCT Application No. PCT/JP2017/004573, dated Sep. 27, 2018, 06 pages of English Translation and 03 pages of IPRP.

Non-Final Office Action for U.S. Appl. No. 16/081,626, dated Feb. 3, 2020, 16 pages.

Notice of Allowance for U.S. Appl. No. 16/081,626, dated May 20, 2020, 08 pages.

* cited by examiner

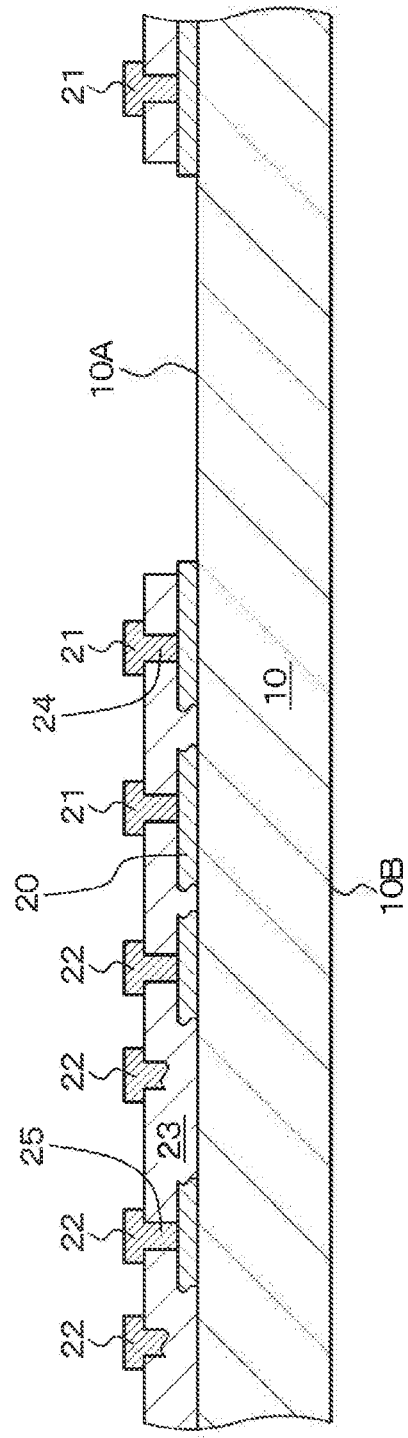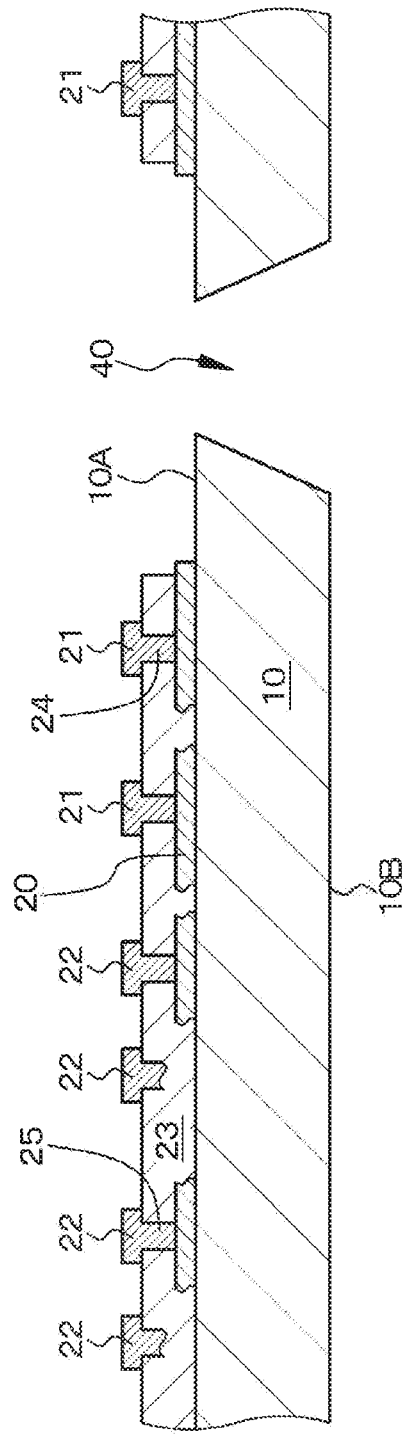

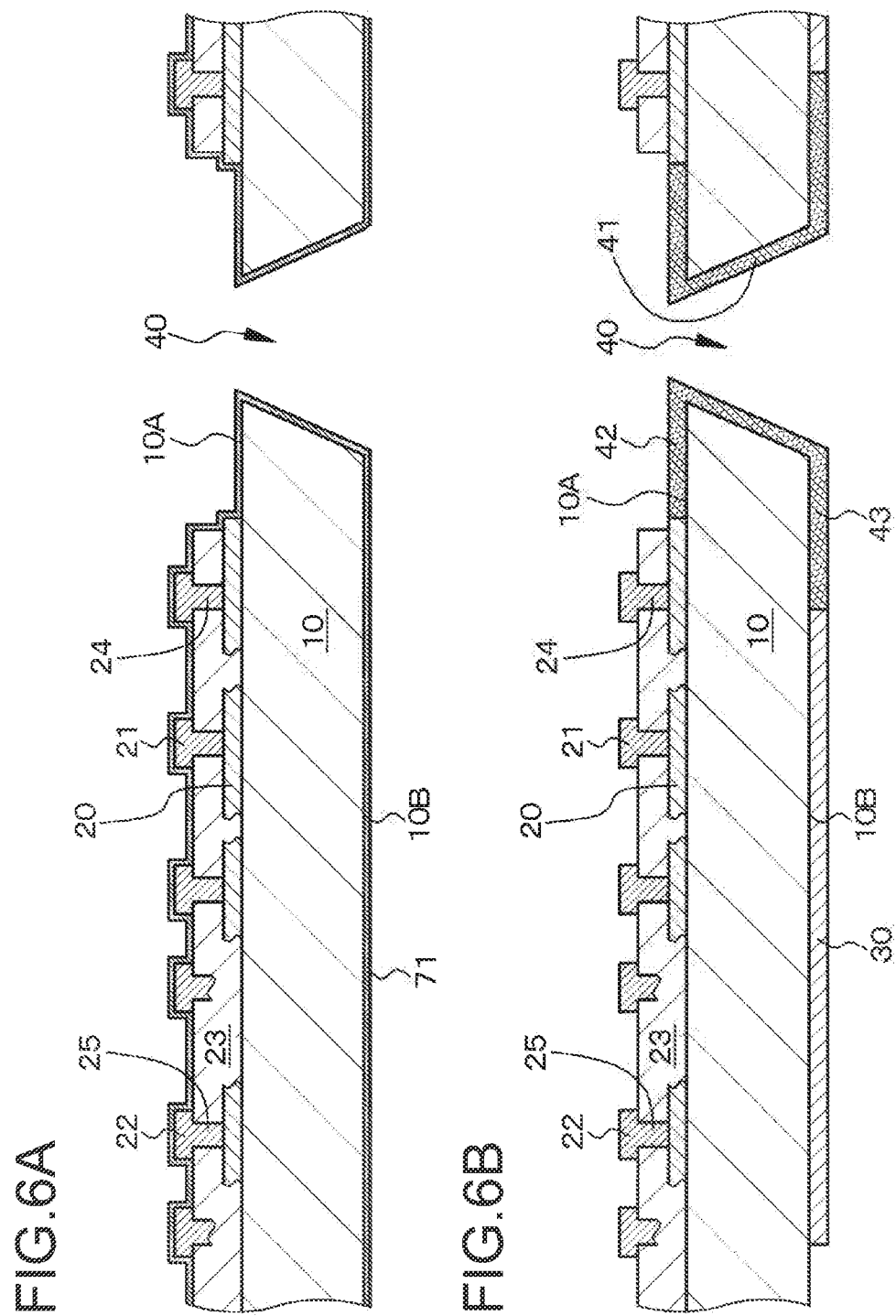

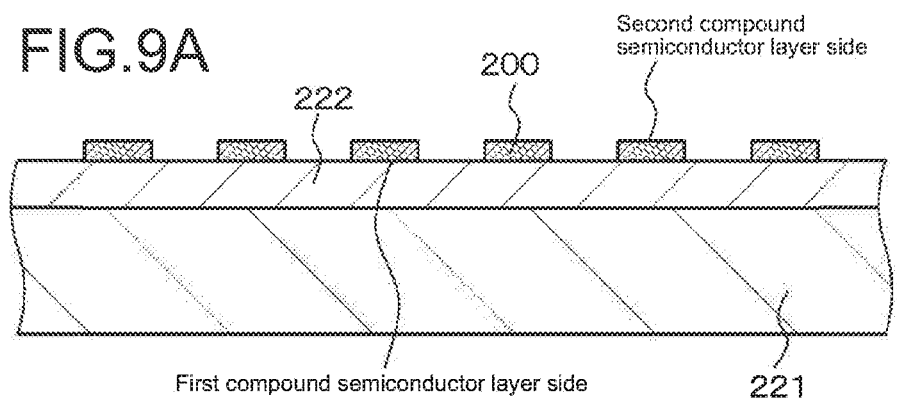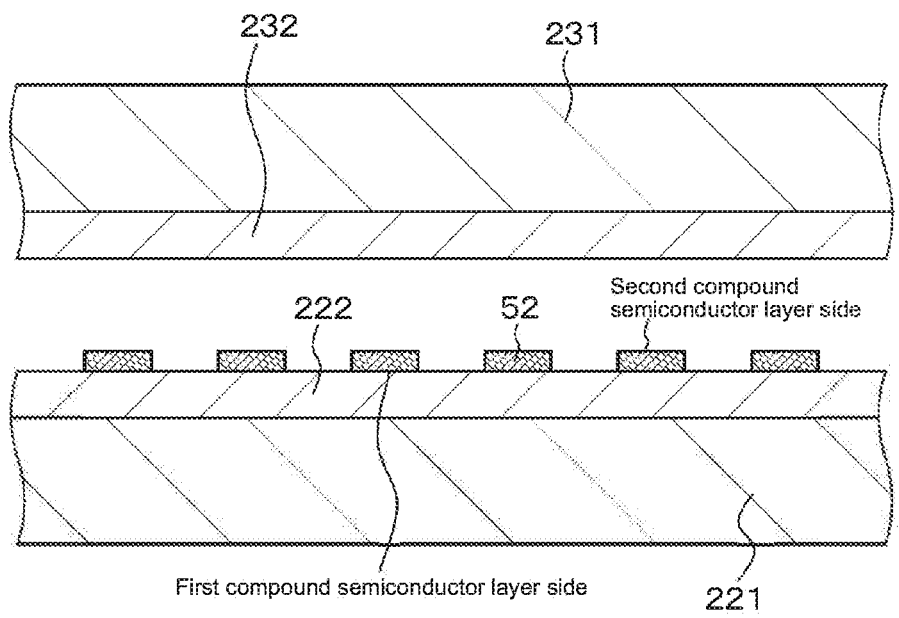

GLASS WIRING SUBSTRATE, METHOD OF PRODUCING THE SAME, PART-MOUNTED GLASS WIRING SUBSTRATE, METHOD OF PRODUCING THE SAME, AND DISPLAY APPARATUS SUBSTRATE

CROSS REFERENCE TO RELATED APPLICATIONS

This application is continuation application of U.S. patent application Ser. No. 16/081,626, filed on Aug. 31, 2018, which is a U.S. National Phase of International Patent Application No. PCT/JP2017/004573 filed on Feb. 8, 2017, which claims priority benefit of Japanese Patent Application No. JP 2016-050473 filed in the Japan Patent Office on Mar. 15, 2016. Each of the above-referenced applications is hereby incorporated herein by reference in its entirety.

TECHNICAL FIELD

The present disclosure relates to a glass wiring substrate, a method of producing the same, a part-mounted glass wiring substrate, a method of producing the same, and a display apparatus substrate.

BACKGROUND ART

In an existing printed wiring board, a first wiring portion formed on a first surface of the printed wiring board and a second wiring portion formed on a second surface of the printed wiring board opposite to the first surface are connected to each other via a through-hole portion. Further, a wiring pitch of the first wiring portion in the vicinity of the through-hole portion and a wiring pitch of the second wiring portion in the vicinity of the through-hole portion are often the same, and the diameter of the through-hole portion on a first surface side and the diameter of the through-hole portion on a second surface side have the same size.

A display apparatus substrate in which a wiring portion is formed only on one surface of a glass substrate and a plurality of light-emitting devices, specifically, light emitting diodes (LEDs) are mounted on the wiring portion is well-known from, for example, Japanese Patent Application Laid-open No. 2009-037164. In such a display apparatus substrate, high integration of the wiring portion is achieved by miniaturization of the wiring portion. Specifically, in this Patent Literature, the wiring pitch of 30 µm is achieved. Further, the wiring portion is connected to an external circuit in a so-called frame portion in the display apparatus. However, with such a structure, manufacture of a display apparatus with a narrow frame is limited in some cases, and it is difficult to apply it to a tiling type display apparatus in which a plurality of display apparatus substrates are arranged.

A display apparatus substrate including a glass substrate having a structure similar to that of an existing double-sided printed wiring board is assumed. Note that in the case of using a double-sided printed wiring board, since deformation of the substrate itself due to moisture absorption and heat is large, it is difficult to deal with high definition of the display apparatus with the pixel pitch of 1 mm or less. That is, a display apparatus substrate in which a first wiring portion is formed on a first surface of a glass substrate, a second wiring portion is formed on a second surface of the glass substrate opposite to the first surface, and a plurality of light-emitting devices, specifically, light emitting diodes (LEDs) are mounted on the first wiring portion is assumed. It only needs to connect the first wiring portion and the second wiring portion to each other via a through-hole portion (through electrode) provided in the glass substrate. Then, the plurality of light-emitting devices and a driving semiconductor apparatus driving the plurality of light-emitting devices are mounted on the first wiring portion. Specifically, the driving semiconductor apparatus is mounted on a driving semiconductor device mounting portion provided on the first wiring portion, and connected from driving semiconductor device mounting portion to the second wiring portion via the through-hole portion. Further, each of the plurality of light-emitting devices is mounted on a light-emitting device mounting portion provided on the first wiring portion, and connected to the driving semiconductor apparatus via the first wiring portion. Here, a light-emitting device unit (e.g., three light-emitting devices, i.e., a light-emitting device that emits red light, a light-emitting device that emits green light, and a light-emitting device that emits blue light) constitute one pixel.

CITATION LIST

Patent Literature

Patent Literature 1: Japanese Patent Application Laid-open No. 2009-037164

DISCLOSURE OF INVENTION

Technical Problem

Incidentally, in a display apparats with the pixel pitch of 1 mm or less, the distance between regions occupied by adjacent pixels is, for example, not more than 0.5 mm. Further, it is necessary to form a through-hole portion (through electrode) between the regions occupied by adjacent pixels. Therefore, the diameter of through-hole portion is, for example, 0.25 mm or less. Meanwhile, in order to impart a sufficient strength to the display apparatus substrate, it is necessary to set the thickness of the glass substrate to, for example, not less than 0.5 mm. Therefore, the aspect ratio of the through-hole portion is not less than two. However, it is technically difficult to form a through-hole portion having such a high aspect ratio in the glass substrate, which causes a problem of reduction in productivity of the display apparatus substrate.

Therefore, it is an object of the present disclosure to provide a glass wiring substrate having a configuration and a structure capable of relatively easily forming a through-hole portion (through electrode) in a glass substrate, a method of producing the same, a part-mounted glass wiring substrate, a method of producing the same, and a display apparatus substrate.

Solution to Problem

In order to achieve the above-mentioned object, a method of producing a glass wiring substrate according to the present disclosure or a method of producing a part-mounted glass wiring substrate according to the present disclosure includes:

preparing a glass substrate, a first wiring portion being formed on a first surface of the glass substrate, no wiring portion being formed on a second surface opposite to the first surface;

forming, in the glass substrate, a through-hole from a second surface side, the through-hole being in a region in which the first wiring portion is not formed, the through-hole having a diameter on the second surface side larger than a diameter on a first surface side; and then, forming a through-hole portion from inside of the through-hole to the first wiring portion, and forming, on the second surface, a second wiring portion extending from the through-hole portion. In addition, the method of producing a part-mounted glass wiring substrate according to the present disclosure further includes mounting an electronic part on the first wiring portion.

In order to achieve the above-mentioned object, a glass wiring substrate according to the present disclosure or a part-mounted glass wiring substrate according to the present disclosure includes:

a glass substrate, a first wiring portion being formed on a first surface of the glass substrate, a second wiring portion being formed on a second surface opposite to the first surface;

a through-hole formed in a region of the glass substrate in which the first wiring portion and the second wiring portion are not formed, the through-hole having a diameter on a second surface side larger than a diameter on a first surface side; and a through-hole portion formed in the through-hole, one end portion of the through-hole portion extending to the first wiring portion, the other end portion of the through-hole portion extending to the second wiring portion. The part-mounted glass wiring substrate according to the present disclosure further includes an electronic part mounted on the first wiring portion. Further, in the glass wiring substrate according to the present disclosure or the part-mounted glass wiring substrate according to the present disclosure, a wiring pitch $P_1$ of the first wiring portion in the vicinity of the through-hole portion is narrower than a wiring pitch $P_2$ of the second wiring portion in the vicinity of the through-hole portion.

In order to achieve the above-mentioned object, a display apparatus substrate according to the present disclosure includes a glass substrate, a first wiring portion being formed on a first surface of the glass substrate, a second wiring portion being formed on a second surface opposite to the first surface;

a through-hole formed in a region of the glass substrate in which the first wiring portion and the second wiring portion are not formed, the through-hole having a diameter on a second surface side larger than a diameter on a first surface side;

a through-hole portion formed in the through-hole, one end portion of the through-hole portion extending to the first wiring portion, the other end portion of the through-hole portion extending to the second wiring portion; and an electronic part mounted on the first wiring portion, in which a wiring pitch $P_1$ of the first wiring portion in the vicinity of the through-hole portion is narrower than a wiring pitch $P_2$ of the second wiring portion in the vicinity of the through-hole portion, the electronic part includes a plurality of light-emitting devices and a driving semiconductor apparatus driving the plurality of light-emitting devices, the driving semiconductor apparatus is mounted on a driving semiconductor device mounting portion provided on the first wiring portion, and connected from the driving semiconductor device mounting portion to the second wiring portion via the through-hole portion, and each of the plurality of light-emitting devices is mounted on a light-emitting device mounting portion provided on the first wiring portion, and connected to the driving semiconductor apparatus via the first wiring portion.

Advantageous Effects of Invention

In the glass wiring substrate, the method of producing the same, the part-mounted glass wiring substrate, the method of producing the same, and the display apparatus substrate according to the present disclosure, since the through-hole having the diameter on the second surface side larger than the diameter on the first surface side is formed in the glass substrate and the through-hole portion is formed in the through-hole, it is possible to relatively easily form a through-hole portion having a high aspect ratio, which does not result in reduction in the productivity of the display apparatus substrate and the like. It should be noted that the effects described herein are merely examples and are not limited, and additional effects may be provided.

BRIEF DESCRIPTION OF DRAWINGS

FIG. 5A and FIG. 5B are each a schematic partial end view of a glass substrate and the like for describing a method of producing the glass wiring substrate and a method of producing the part-mounted glass wiring substrate of the embodiment 1.

FIG. 6A and FIG. 6B are each a schematic partial end view of the glass substrate and the like for describing the method of producing the glass wiring substrate and the method of producing the part-mounted glass wiring substrate of the embodiment 1, subsequently to FIG. 5B.

FIG. 9A and FIG. 9B are each a conceptual diagram showing the cross-section of the light-emitting device and the like for describing the method of mounting the light-emitting device in the embodiment 1, subsequently to FIG. 8B.

MODE(S) FOR CARRYING OUT THE INVENTION

Figure 1:
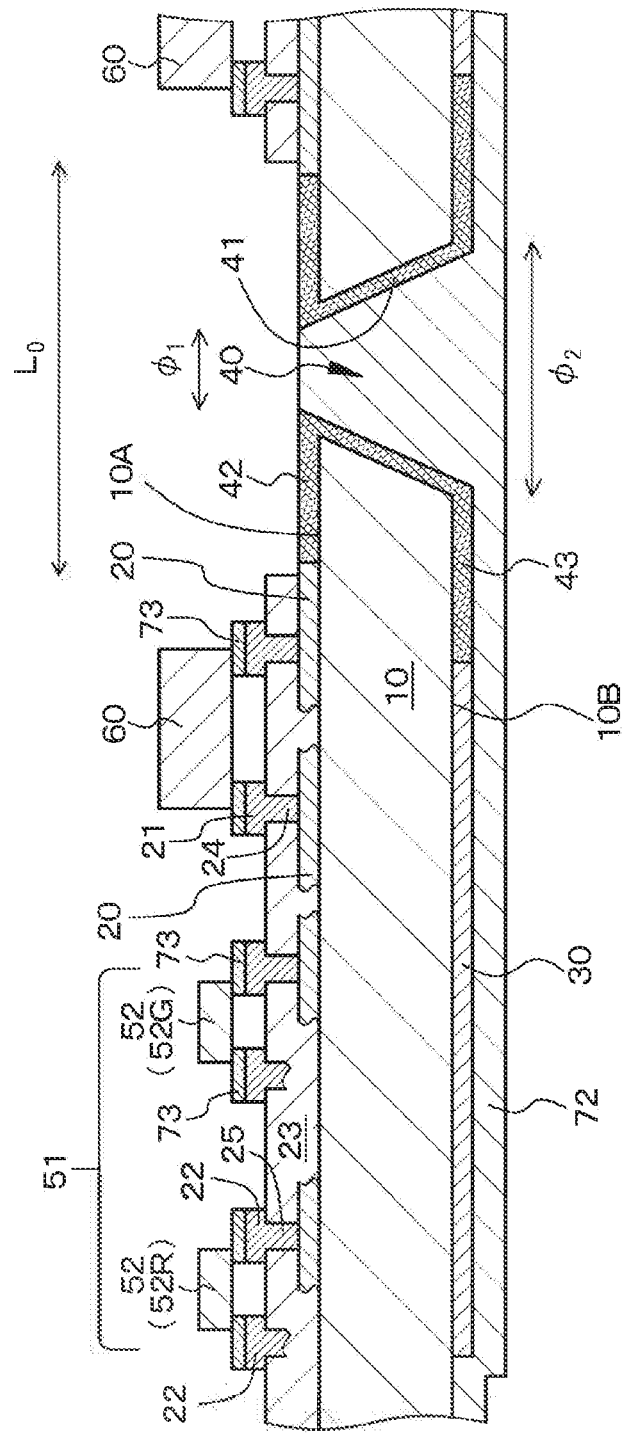
FIG. 1 is a schematic partial end view of a glass wiring substrate, a part-mounted glass wiring substrate, and a display apparatus substrate of an embodiment 1.

Hereinafter, the present disclosure will be described on the basis of embodiments with reference to the drawings. The present disclosure is not limited to the embodiments, and various numerical values or materials in the embodiments are examples. Note that the description will be given in the following order.
1. General description regarding glass wiring substrate, method of producing the same, part-mounted glass wiring substrate, method of producing the same, and display apparatus substrate of present disclosure
2. Embodiment 1 (glass wiring substrate, method of producing the same, part-mounted glass wiring substrate, method of producing the same, and display apparatus substrate of present disclosure) 3. Others General Description Regarding Glass Wiring Substrate, Method of Producing the Same, Part-Mounted Glass Wiring Substrate, Method of Producing the Same, and Display Apparatus Substrate of Present Disclosure In a part-mounted glass wiring substrate and a method of producing the same according to the present disclosure, the electronic part may include a plurality of light-emitting devices and a driving semiconductor apparatus driving the plurality of light-emitting devices,
the driving semiconductor apparatus may be mounted on a driving semiconductor device mounting portion provided on the first wiring portion, and connected from the driving semiconductor device mounting portion to the second wiring portion via the through-hole portion, and
each of the plurality of light-emitting devices may be mounted on a light-emitting device mounting portion provided on the first wiring portion, and connected to the driving semiconductor apparatus via the first wiring portion. Further, in this case, alternatively, in a display apparatus substrate according to the present disclosure,
the light-emitting device unit may constitute one pixel, and where a distance between regions occupied by adjacent pixels is represented by $L_0$ and a diameter of the through-hole on a first surface side is represented by $\varphi_1$, a relationship of $0.1 \leq \varphi_1/L_0 \leq 0.9$ may be satisfied although not limited thereto. Specific examples of the value of $L_0$ include, but not limited to, 0.2 mm to 0.9 mm.

Here, when the number of light-emitting devices is represented by "M", the value of M can be not less than three. The upper limit of the value of the number M of light-emitting devices connected to one driving semiconductor apparatus is not particularly limited as long as the driving semiconductor apparatus is capable of appropriately driving the M light-emitting devices. Further, when the number of light-emitting devices in the light-emitting device unit constituting one pixel is represented by "N", the value of N can be not less than three as will be described below. Further, when the number of light-emitting device units is represented by $U_0$, a relationship of $M = U_0 \times N$ is satisfied.

Depending on the use and function of a display apparatus (light-emitting device display apparatus) including a display apparatus substrate, the specification required for the display apparatus, and the like, the number, type, mounting (arrangement), interval, and the like of light-emitting devices constituting the light-emitting device unit are determined. In the case of a display apparatus of color display, one pixel in the display apparatus includes, for example, a combination (light-emitting device unit) of a red light-emitting device (red light-emitting sub-pixel), a green light-emitting device (green light-emitting sub-pixel), and a blue light-emitting device (blue light-emitting sub-pixel). Further, each light-emitting device constitutes a sub-pixel. Further, a plurality of light-emitting device units are arranged in a two-dimensional matrix pattern in a first direction and a second direction orthogonal to the first direction. When the number of red light-emitting devices constituting the light-emitting device unit is $N_R$, the number of green light-emitting devices constituting the light-emitting device unit is $N_G$, and the number of blue light-emitting devices constituting the light-emitting device unit is $N_B$, $N_R$ may be an integer of 1 or 2 or more, $N_G$ may be an integer of 1 or 2 or more, and $N_B$ may be an integer of 1 or 2 or more. The values of $N_R$, $N_G$, and $N_B$ may be equal to or different from each other. In the case where the values of $N_R$, $N_G$, and $N_B$ are each an integer of 2 or more, the light-emitting devices may be connected in series or in parallel in one light-emitting device unit. Examples of the combination of the values of $(N_R, N_G, \text{and } N_B)$ include, but not limited to, (1, 1, 1), (1, 2, 1), (2, 2, 2), and (2, 4, 2). In the case where one pixel includes three types of sub-pixels, examples of the arrangement of the three kinds of sub-pixels include delta arrangement, stripe arrangement, diagonal arrangement, and rectangle arrangement. Further, it only needs to cause the light-emitting device to be driven with a constant current on the basis of a PWM driving method. Alternatively, by preparing three panels, i.e., a first panel that includes a light-emitting unit including the red light-emitting device, a second panel that includes a light-emitting unit including the green light-emitting device, and a third panel that includes a light-emitting unit including the blue light-emitting device, it can also be applied to a projector that collects light from the three panels by using, for example, a dichroic prism.

The method of producing the part-mounted glass wiring substrate and the method of producing the glass wiring substrate of the present disclosure including the favorable configuration described above may further include forming the first wiring portion on the first surface of the glass substrate by forming a metal layer (including an alloy layer) on the first surface of the glass substrate on the basis of a physical vapor deposition method (PVD method) and then patterning the metal layer; and forming the through-hole portion and the second wiring portion on the basis of a plating method. Further, in the method of producing the part-mounted glass wiring substrate and the method of producing the glass wiring substrate of the present disclosure including the various favorable configurations described above, a wiring pitch $P_1$ of the first wiring portion in the vicinity of the through-hole portion may be narrower than a wiring pitch $P_2$ of the second wiring portion in the vicinity of the through-hole portion. Specifically, a relationship of $P_2/P_1 \geq 10$ may be satisfied. The wiring pitch $P_1$ and the wiring pitch $P_2$ are determined by terminal pitches of the electronic parts and various parts mounted on the first wiring portion and the second wiring portion in the vicinity of the through-hole portion. As an example, in the case where an electronic part having the size of 100 μm includes three terminals in one end portion, the terminal pitch is 100/3=33 μm and the wiring pitch $P_1$ is 33 μm.

A metal layer is formed on the first surface of the glass substrate on the basis of a PVD method. Specific examples of the method include a sputtering method and a vacuum evaporation method. The patterning of the metal layer can be performed on the basis of a well-known method such as a wet etching method and a dry etching method. The first wiring portion may be provided in one layer or a plurality of layers of two or more layers. That is, the first wiring portion may have a single layer wiring structure or a multilayer wiring structure.

The through-hole portion and the second wiring portion are formed on the basis of a plating method. Specifically, they can be formed on the basis of a combination of an electroless plating method and an electrolytic plating method, more specifically, a combination of an electroless copper plating method and an electrolytic copper plating method, for example. Alternatively, they can be formed on the basis of a combination of a PVD method and an electrolytic plating method. However, the formation of the through-hole portion and the second wiring portion is not limited to these methods, and a combination of a PVD method and an etching method such as a sputtering method and a vacuum evaporation method can be adopted.

In the part-mounted glass wiring substrate, the glass wiring substrate, and the display apparatus substrate of the present disclosure including the favorable configuration described above, the second wiring portion and the through-hole portion may be formed of the same material, and the first wiring portion may be formed of a material different from a material forming the second wiring portion. Further, in the part-mounted glass wiring substrate, the glass wiring substrate, and the display apparatus substrate of the present disclosure including the favorable configuration described above, a relationship of $P_2/P_1 \geq 10$ may be satisfied.

In the glass wiring substrate, the method of producing the same, the part-mounted glass wiring substrate, the method of producing the same, and the display apparatus substrate of the present disclosure including the various favorable configurations described above (hereinafter, collectively referred to simply as "the present disclosure" in some cases), examples of the glass substrate include high strain point glass, soda glass ($Na_2O \cdot CaO \cdot SiO_2$), borosilicate glass ($Na_2O \cdot B_2O_3 \cdot SiO_2$), forsterite ($2MgO \cdot SiO_2$), and lead glass ($Na_2O \cdot PbO \cdot SiO_2$). Examples of the thickness of the glass substrate include 0.1 mm to 1.1 mm. Examples of the material forming the second wiring portion and the through-hole portion include copper (Cu), nickel (Ni), silver (Ag), gold (Au), aluminum (Al), and an alloy containing these metals. Further, examples of the underlayer adhering a metal layer formed of these metals or the like to a base include nickel (Ni), titanium (Ti), molybdenum (Mo), chromium (Cr), tantalum (Ta), and an alloy containing these metals. Examples of the material forming the material forming the first wiring portion include aluminum (Al), copper (Cu), nickel (Ni), silver (Ag), gold (Au), and an alloy containing these metals. Further, examples of the underlayer adhering a metal layer formed of these metals or the like to a base include nickel (Ni), titanium (Ti), molybdenum (Mo), chromium (Cr), tantalum (Ta), and an alloy containing these metals. Specific examples of the glass substrate having the first surface on which the first wiring portion is formed and the second surface on which no wiring portion is formed opposite to the first surface include a glass substrate similar to a glass substrate for a liquid crystal display apparatus.

The shape (i.e., shape of the inner surface (inner wall) of the through-hole when the glass substrate is cut with a virtual plane including an axis line of the through-hole) of the inner surface (inner wall) of the through-hole in the glass substrate may be any shape as long as the diameter ($\varphi 2$) on the second surface side is larger than the diameter ($\varphi 1$) on the first surface side, and may be, for example, a tapered shape or a staircase shape. The through-hole in the glass substrate can be formed by using a laser, for example. Specifically, for example, the through-hole can be formed in the glass substrate on the basis of trepanning processing using a laser. Further, by using a laser, a through-hole having a tapered shape or a staircase shape can be formed. Further, by optimizing the processing conditions by a laser, a through-hole having the diameter ($\varphi 2$) on the second surface side larger than the diameter ($\varphi 1$) on the first surface side can be formed. Alternatively, by performing drill processing, a through-hole having a staircase shape can be formed. Alternatively, by adopting a sand blasting method, a through-hole having a tapered shape can be formed. Examples of the value of $\varphi_1/\varphi_2$ include $0.1 \leq \varphi_1/\varphi_2 < 1.0$.

Examples of the method of mounting the driving semiconductor apparatus on the driving semiconductor device mounting portion provided on the first wiring portion and the method of mounting the light-emitting device on the light-emitting device mounting portion provided on the first wiring portion include, but not limited to, a plating method. In addition, for example, a method of using a solder ball or a solder bump may be used.

In the present disclosure, the light-emitting device may include a light-emitting diode (LED). However, the present disclosure is not limited thereto, and it may include a semiconductor laser device or the like. In the case where the light-emitting device include a light-emitting diode or a semiconductor laser device, the size (e.g., chip size) of the light-emitting device is not particularly limited, but is typically small, specifically, for example, not more than 1 mm, not more than 0.3 mm, or not more than 0.1 mm, more specifically, not more than 0.03 mm. Examples of the material forming the light-emitting layer of each of the red light-emitting device that emits red light, the green light-emitting device that emits green light, and the blue light-emitting device that emits blue light include one using a III-V compound semiconductor. Further, examples of the material forming the light-emitting layer of the red light-emitting device include one using an AlGaInP-based compound semiconductor. Examples of the III-V compound semiconductor include a GaN-based compound semiconductor (including an AlGaN mixed crystal, an AlGaInN mixed crystal, and a GaInN mixed crystal), a GaInNAs-based compound semiconductor (including a GaInAs mixed crystal and a GaNAs mixed crystal), an AlGaInP-based compound, an AIAs-based compound semiconductor, an AlGaInAs-based compound semiconductor, an AlGaAs-based compound semiconductor, a GaInAs-based compound semiconductor, a GaInAsP-based compound semiconductor, a GaInP-based compound semiconductor, a GaP-based compound semiconductor, an InP-based compound semiconductor, an InN-based compound semiconductor, and an AlN-based compound semiconductor.

The light-emitting layer has a stacked structure of a first compound semiconductor layer having a first conductivity type, an active layer, and a second compound semiconductor layer having a second conductivity type different from the first conductivity type. Note that in the case where the first conductivity type is an n-type, the second conductivity type is a p-type. In the case where the first conductivity type is a p-type, the second conductivity type is an n-type. Examples of the n-type impurity to be added to the compound semiconductor layer include silicon (Si), selenium (Se), germanium (Ge), tin (Sn), carbon (C), and titanium (Ti). Examples of the p-type impurity include zinc (Zn), magnesium (Mg), beryllium (Be), cadmium (Cd), calcium (Ca), barium (Ba), and oxygen (O). The active layer may include a single compound semiconductor layer, or may have single quantum well structure (SQW structure) or a multiple quantum well structure (MQW structure). Examples of forming (depositing) various compound semiconductor layers including the active layer include a metal-organic chemical vapor deposition (MOCVD method, MOVPE method), a metal-organic molecular beam epitaxy method (MOMBE method), a hydride vapor phase epitaxy method (HVPE method) in which halogen contributes to transport or reaction, a plasma-assisted physical vapor deposition (PPD method), an atomic layer deposition method (ALD method, atomic layer deposition method), and a migration-enhanced epitaxy method (Migration-Enhanced. Epitaxy, MEE method). In order to produce the red light-emitting device, the green light-emitting device, and the blue light-emitting device, it only needs to appropriately select the above-mentioned compound semiconductor and the composition thereof.

In the case where the first conductivity type is an n-type and the second conductivity type is a p-type, the first electrode is an n-side electrode and the second electrode is a p-side electrode. Meanwhile, in the case where the first conductivity type is a p-type and the second conductivity type is an n-type, the first electrode is a p-side electrode and the second electrode is an n-side electrode. Here, examples of the p-side electrode include Au/AuZn, Au/Pt/Ti(/Au)/AuZn, Au/Pt/TiW(/Ti)(/Au)/AuZn, Au/AuPd, Au/Pt/Ti(/Au)/Au Pd, Au/Pt/TiW(/Ti)(/Au)/AuPd, Au/Pt/Ti, Au/Pt/TiW(/Ti), Au/Pt/TiW/Pd/TiW(/Ti), Ti/Cu, Pt, Ni, Ag, and Ge. Further, examples of the n-side electrode include Au/Ni/AuGe, Au/Pt/Ti(/Au)/Ni/AuGe, AuGe/Pd, Au/Pt/TiW(/Ti)/Ni/AuGe, and Ti. Note that the layer that is further to the front than "/" is located electrically more distant from the active layer. Alternatively, the second electrode may be formed of a transparent conductive material such as ITO, IZO, ZnO:Al, and ZnO:B. In the case where a layer formed of the transparent conductive material is used as a current diffusion layer and the second electrode is an n-side electrode, the metal stacked structure mentions in the case of using the second electrode of the p-side electrode may be combined. A first pad portion may be formed on (surface of) the first electrode, and a second pad portion may be formed on (surface of) the second electrode. It is desirable that the pad portion has a single layer structure or a multilayer structure including at least one type of metal selected from the group consisting of Ti (titanium), aluminum (Al), Pt (platinum), Au (gold), and Ni (nickel). Alternatively, the pad portions may have a multilayer structure exemplified by a multilayer configuration of Ti/Pt/Au and a multilayer configuration of Ti/Au.

Examples of the light-emitting device production substrate for producing the light-emitting device include a GaAs substrate, a GaP substrate, an AlN substrate, an AlP substrate, an InN substrate, an InP substrate, an AlGaInN substrate, an AlGaN substrate, an AlInN substrate, a GaInN substrate, an AlGaInP substrate, an AlGaP substrate, an AlInP substrate, a GaInP substrate, a ZnS substrate, a sapphire substrate, a SiC substrate, an alumina substrate, a ZnO substrate, a LiMgO substrate, a LiGaO$_2$ substrate, a MgAl$_2$O$_4$ substrate, a Si substrate, a Ge substrate, and one obtained by forming an underlayer or a buffer layer on the surface (main surface) of these substrates. Note that in order to produce the red light-emitting device, the green light-emitting device, and the blue light-emitting device, it only needs to appropriately select one of these substrates.

In the light-emitting device, a light-shielding film may be formed in a desired region of the light-emitting device so that an undesired region is not irradiated with the light output from the light-emitting device. Examples of the material forming the light-shielding film include a material capable of blocking light such as titanium (Ti), chromium (Cr), tungsten (W), tantalum (Ta), aluminum (Al), and MoSi$_2$.

Embodiment 1

An embodiment 1 relates to the glass wiring substrate, the method of producing the same, the part-mounted glass wiring substrate, the method of producing the same, and the display apparatus substrate of the present disclosure.

As shown in a schematic partial end view of FIG. 1, the glass wiring substrate, part-mounted glass wiring substrate, or display apparatus substrate of the embodiment 1 includes:

a glass substrate 10, a first wiring portion 20 being formed on a first surface 10A of the glass substrate 10, a second wiring portion 30 being formed on a second surface 10B opposite to the first surface 10A;

a through-hole 40 formed in a region of the glass substrate 10 in which the first wiring portion 20 and the second wiring portion 30 are not formed, the through-hole 40 having a diameter ($\varphi_2$) on a second surface side larger than a diameter ($\varphi_1$) on a first surface side; and a through-hole portion 41 formed in the through-hole 40, one end portion of the through-hole portion 41 extending to the first wiring portion 20, the other end portion of the through-hole portion 41 extending to the second wiring portion 30.

Further, the display apparatus substrate or display apparatus substrate of the embodiment 1 further includes electronic parts 52 and 60 mounted on the first wiring portion 20. Further, in the glass wiring substrate, part-mounted glass wiring substrate, or display apparatus substrate of the embodiment 1, a wiring pitch $P_1$ of the first wiring portion 20 in the vicinity of the through-hole portion 41 is narrower than a wiring pitch $P_2$ of the second wiring portion 30 in the vicinity of the through-hole portion 41.

Here, in the display apparatus substrate or part-mounted glass wiring substrate of the embodiment 1, the electronic part includes a plurality of light-emitting devices (specifically, light emitting diodes, LEDs) 52 and a driving semiconductor apparatus 60 driving the plurality of light-emitting devices 52, the driving semiconductor apparatus 60 is mounted on a driving semiconductor device mounting portion 21 provided on the first wiring portion 20, and connected from the driving semiconductor device mounting portion 21 to the second wiring portion 30 via the through-hole portion 41, and each of the plurality of light-emitting devices 52 is mounted on a light-emitting device mounting portion 22 provided on the first wiring portion 20, and connected to the driving semiconductor apparatus 60 via the first wiring portion 20. Further, the second wiring portion 30 and the through-hole portion 41 are formed of the same material (specifically, copper), and the first wiring portion 20 is formed of a material (specifically, aluminum) different from a material forming the second wiring portion 30. Further, a light-emitting device unit 51 constitutes one pixel, and when a distance between regions 50 occupied by adjacent pixels is represented by $L_0$ and a diameter of the through-hole 40 on a first surface 1 is represented by $\varphi_1$, a relationship of $0.1 \leq \varphi_1/L_0 \leq 0.9$ is satisfied. Further, a relationship of $P_2/P_1 \geq 10$ is satisfied. Specifically, examples of the values of $P_1$, $P_2$, $\varphi_1$, $\varphi_2$, and $L_0$ include the following values.

$P_1$=0.02 mm
$P_2$=0.2 mm
$\varphi_1$=0.3 mm
$\varphi_2$=0.6 mm
$L_0$=0.6 mm

The shape of the inner surface (inner wall) of the through-hole 40 in the glass substrate 10 is a tapered shape in the illustrated example. Further, examples of the number M of the plurality of light-emitting devices 52 connected to one driving semiconductor apparatus 60 include $U_0$=100, N=3, and M=$U_0 \times$N=300. Although various electronic parts are mounted also on the second wiring portion 30, illustration thereof is omitted. As described above, the driving semiconductor apparatus 60 is connected from the driving semiconductor device mounting portion 21 to the second wiring portion 30 and a display apparatus driving circuit mounted on the second wiring portion 30 via the through-hole portion 41. Alternatively, it is connected to an externally provided display apparatus driving circuit via the second wiring portion 30.

In the display apparatus substrate of the embodiment 1, one pixel includes, for example, a combination (light-emitting device unit 51) of one red light-emitting device 52R, one green light-emitting device 52G, and one blue light-emitting device 52B. That is, $N_R=N_G=N_B=1$. Each light-emitting device 52 constitutes a sub-pixel. Further, a plurality of light-emitting device unit 51 are arranged in a two-dimensional matrix pattern in a first direction and a second direction orthogonal to the first direction. Specific examples of the size of one light-emitting device 52 include 30 μm×30 μm. Specific examples of the size of the light-emitting device unit 51 include 0.1 mm×0.1 mm. However, the present disclosure is not limited to these values. In the figures, one red light-emitting device 52R and one green light-emitting device 52G are shown.

Figure 3A:
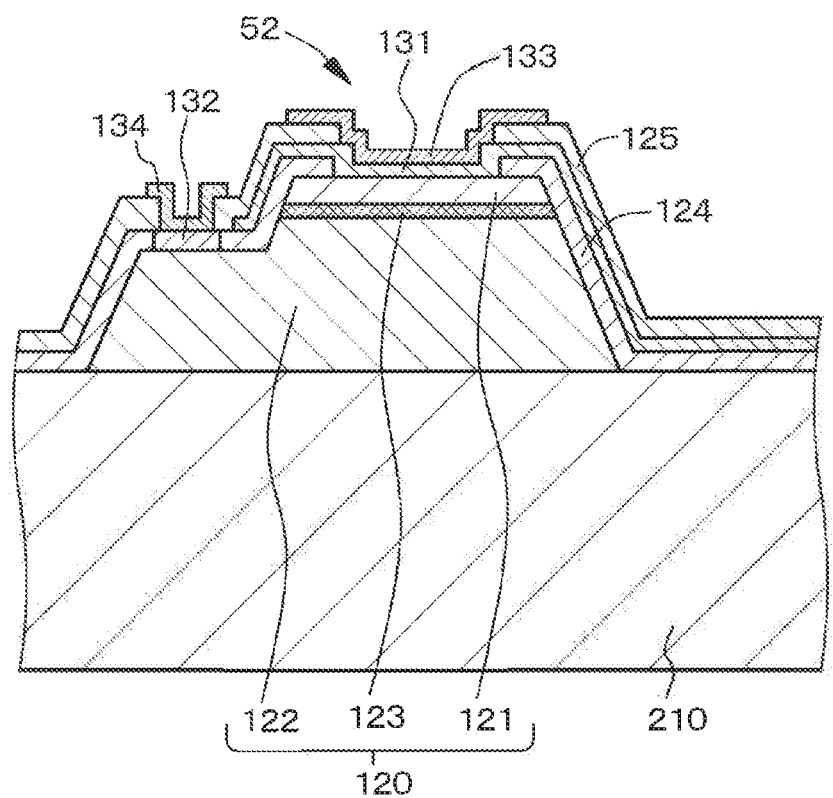
FIG. 3A and FIG. 3B are each a schematic partial end view of a light-emitting device (light emitting diode) in the embodiment 1.
Figure 3B:
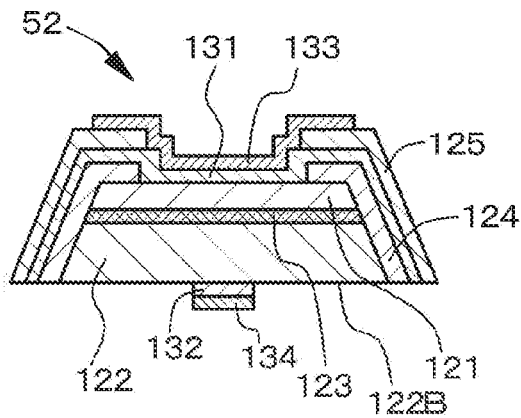

As shown in a schematic partial end view of FIG. 3A or FIG. 3B, the light-emitting device (specifically, light emitting diode) 52 includes a light-emitting layer 120, a first electrode 131, and a second electrode 132 electrically connected to the light-emitting layer 120. Here, the light-emitting layer 120 has a stacked structure of a first compound semiconductor layer 121 having a first conductivity type (specifically, a p-type), an active layer 123, and a second compound semiconductor layer 122 having a second conductivity type (specifically, an n-type) different from the first conductivity type. Light emitted from the active layer 123 is emitted to the outside via the second compound semiconductor layer 122. The light-emitting device 52 includes one red light-emitting device 52R, one green light-emitting device 52G, or one blue light-emitting device 52B. The specific configurations of the red light-emitting device 52R, the green light-emitting device 52G, and the blue light-emitting device 52B are, for example, as shown in the following Table 1 and Table 2. Note that the light-emitting device shown in FIG. 3A and the light-emitting device shown in FIG. 3B are different in the position where the second electrode 132 is located. Further, a light-emitting device production substrate 210 described next is eventually removed.

That is, in the red light-emitting device 52R, the light-emitting layer (stacked structure) 120 including the second compound semiconductor layer 122 having an n-conductivity type, the active layer 123, and the first compound semiconductor layer 121 having a p-conductivity type is formed of an AlGaInP-based compound semiconductor. As the light-emitting device production substrate 210 for producing the red light-emitting device 52R, an n-GaAs substrate was used. The second compound semiconductor layer 122 is formed on the light-emitting device production substrate 210. The active layer 123 has a multiquantum well structure in which well layers each including a GaInP layer or an AlGaInP layer and barrier layers each including an AlGaInP layer having a different composition are stacked. Specifically, the barrier layers have four layers, and the well layers have three layers. The light-emitting layer 120 is covered by a first insulating film 124, except for a light output surface 122S of the second compound semiconductor layer 122. A second insulating film 125 is formed on the first electrode 131 and the first insulating film 124. Further, a part of the second insulating film 125 located above the top surface of the first compound semiconductor layer 121 has been removed, and a first pad portion 133 is formed from the exposed first electrode 131 to the second insulating film 125. Further, a part of the second insulating film 125 located above the top surface of the second compound semiconductor layer 122 has been removed, and a second pad portion 134 is formed from the exposed second electrode 132 to the second insulating film 125. The first insulating film is formed of, for example, a silicon nitride ($SiN_Y$), and the second insulating film is formed of, for example, a silicon oxide ($SiO_X$).

TABLE 1

| Red light-emitting device 52R |
|---|
| First compound semiconductor layer |
| Contact layer |
| p-GaAs:Zn-doped |
| Second cladding layerp-AlInP:Zn-doped |
| Second guide layer |
| AlGaInP |
| Active layer |
| Well layer/Barrier layerGaInP/AlGaInP |
| Second compound semiconductor layer |
| First guide layer |
| AlGaInP |
| First cladding layern-AlInP:Si-doped |

In the green light-emitting device 52G and the blue light-emitting device 52B, the light-emitting layer (stacked structure) 120 including the second compound semiconductor layer 122 having an n-conductivity type, the active layer 123, and the first compound semiconductor layer 121 having a p-conductivity type is formed of a GaInN-based compound semiconductor. As the light-emitting device production substrate 210 for producing the green light-emitting device 52G and the blue light-emitting device 52B, an n-GaN substrate was used. The second compound semiconductor layer 122 is formed on the light-emitting device production substrate 210. The active layer 123 has a quantum well structure in which a well layer including an AlInGaN layer and a barrier layer including an AlInGaN layer having a different In composition are stacked. Alternatively, the active layer 123 has a quantum well structure in which a well layer including an InGaN layer and a barrier layer including a GaN layer are stacked.

TABLE 2

| Green light-emitting device 52G/Blue light-emitting device 52B |
| --- |
| First compound semiconductor layer |
| Contact layer |
| p-GaN:Mg-doped |
| Second cladding layerp-AlGaN:Mg-doped |
| Second guide layer |
| InGaN |
| Active layer |
| Well layer/Barrier layerInGaN/GaN |
| Second compound semiconductor layer |
| First guide layer |
| InGaN |
| First cladding layern-AlGaN:Si-doped |

Hereinafter, the method of producing the glass wiring substrate and the method of producing the part-mounted glass wiring substrate of the embodiment 1 will be described with reference to FIG. 5A, FIG. 5B, FIG. 6A, FIG. 6B, and FIG. 7 which are each a schematic partial end view of a glass substrate.

[Step-100]

The glass substrate 10 having a thickness of 0.5 mm is prepared, the first wiring portion 20 being formed on the first surface 10A of the glass substrate 10, no wiring portion being formed on the second surface 10B opposite to the first surface 10A. Specifically, by forming a metal layer formed of aluminum (Al) on the first surface 10A of the glass substrate 10 on the basis of a PVD method (e.g., sputtering method) and then patterning the metal layer on the basis of an etching method, the first wiring portion 20 is formed on the first surface 10A of the glass substrate 10. Subsequently, an insulating layer 23 is formed on the first surface 10A of the glass substrate 10, an opening is provided in a part of the insulating layer 23 located above the first wiring portion 20, and a conductive material layer is formed on the insulating layer 23 including the inside of the opening. Subsequently, by patterning the conductive material layer, the driving semiconductor device mounting portion 21, the light-emitting device mounting portion 22, a contact hole 24 that connects the first wiring portion 20 and the driving semiconductor device mounting portion 21 to each other, and a contact hole 25 that connects the first wiring portion 20 and the light-emitting device mounting portion 22 to each other can be formed. Note that configurations and structures of the first wiring portion 20, the driving semiconductor device mounting portion 21, and the light-emitting device mounting portion 22 are not limited to the illustrated example, and the driving semiconductor device mounting portion 21 and the light-emitting device mounting portion 22 may be directly provided in the first wiring portion 20. Alternatively, the first wiring portion may have a multilayer wiring structure. Although a part of the first wiring portion 20 and a part of the contact holes 24 and 25 are shown in the state of being cut halfway in the figures, actually, they are appropriately connected to each other. In this way, the structure shown in FIG. 5A can be achieved.

[Step-110]

Further, in the glass substrate 10, the through-hole 40 is formed from a second surface side by using a laser, the through-hole 40 being in a region in which the first wiring portion 20 is not formed, the through-hole 40 having a diameter on the second surface side larger than a diameter on a first surface side. In this way, the structure shown in FIG. 5B can be achieved. The drilling processing using a laser can be performed on the basis of a well-known technology. When performing the drilling processing using a laser, it is favorable to prevent, by covering the first surface 10A and the second surface 10B by a protective film, glass scrap or the like generated during the drilling processing from being attached to the first surface 10A and the second surface 10B. After that, it is favorable that the inner wall of the through-hole 40 is washed using hydrofluoric acid.

[Step-120]

Subsequently, a seed layer 71 is formed on the first surface 10A and the second surface 10B including the inside of the through-hole 40 (see FIG. 6A). The formation of the seed layer 71 can be performed on the basis of, for example, an electroless copper plating method. Alternatively, it can be achieved by forming the seed layer 71 including a Ti layer/Cu layer on the basis of a sputtering method. Further, by covering a region that should not be copper-plated with a plating resist layer and then performing electrolytic copper plating, the through-hole portion 41 is formed from the inside of the through-hole 40 to the first wiring portion 20 and the second wiring portion 30 extending from the through-hole portion 41 is formed on the second surface 10B. After that, by removing the plating resist layer and performing soft-etching, the seed layer 71 is removed. In this way, the structure shown in FIG. 6B can be achieved. Note that the seed layer 71 is shown in only FIG. 6A. Further, although the side surface of the first wiring portion 20 and the side surface of the one end portion 42 of the through-hole portion 41 are in contact with each other in the figures, actually, the one end portion 42 of the through-hole portion 41 is formed so that the one end portion 42 of the through-hole portion 41 extends above the first wiring portion 20. Meanwhile, although the side surface of the second wiring portion 30 and the side surface of the other end portion 43 of the through-hole portion 41 are in contact with each other in the figures, actually, the other end portion 43 of the through-hole portion 41 and the second wiring portion 30 are formed to be integrated.

Note that as described above, the wiring pitch $P_1$ of the first wiring portion 20 in the vicinity of the through-hole portion 41 is narrower than the wiring pitch $P_2$ of the second wiring portion 30 in the vicinity of the through-hole portion 41. Specifically, a relationship of $P_2/P_1 \geq 10$ is satisfied.

[Step-130]

Figure 7:
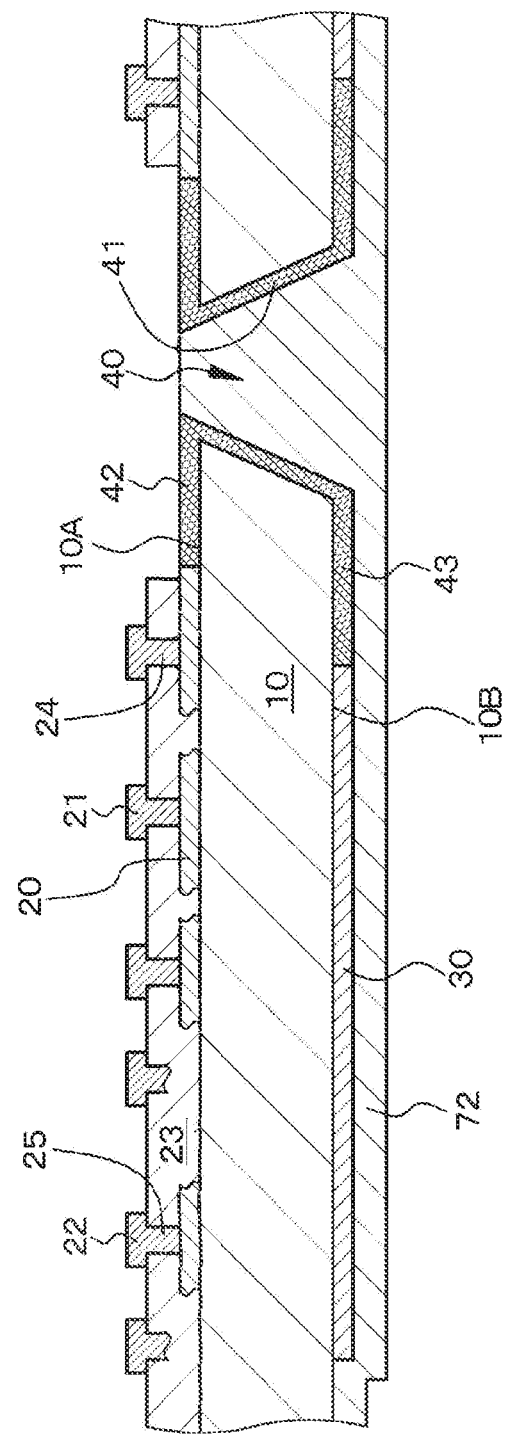
FIG. 7 is a schematic partial end view of the glass substrate and the like for describing the method of producing the glass wiring substrate and the method of producing the part-mounted glass wiring substrate of the embodiment 1, subsequently to FIG. 6B.

After that, the second surface 10B of the glass substrate 10 is covered by a solder resist layer 72 on the basis of, for example, a screen printing method, and the through-hole portion 41 is filled with the solder resist layer 72 (see FIG. 7). The formation of the solder resist layer 72 on the basis of a screen printing method is performed from the second surface side of the glass substrate 10. At this time, it is favorable to protect the first surface 10A of the glass substrate 10 by covering the first surface side of the glass substrate 10 with a protective film.

[Step-140]

Further, the electronic parts 52 and 60 are mounted on the first wiring portion 20 (see FIG. 1).

Specifically, a thermosetting adhesive is applied to a region of the first surface 10A of the glass substrate 10 in which the electronic parts 52 and 60 are to be mounted and the first wiring portion 20 (specifically, the driving semiconductor device mounting portion 21, the light-emitting device mounting portion 22) is not formed. Further, by placing each of the electronic parts 52 and 60 on the thermosetting adhesive and then thermally curing the thermosetting adhesive, the electronic parts 52 and 60 are fixed on the first surface 10A of the glass substrate 10. Subsequently, the first wiring portion 20 and the electronic parts 52 and 60 are connected to each other by a plating layer 73 on the basis of an electrolytic copper plating method. Specifically, the driving semiconductor device mounting portion 21 and a connection terminal portion of the driving semiconductor apparatus 60 are connected to each other by the plating layer 73 on the basis of an electrolytic copper plating method. Further, the light-emitting device mounting portion 22 and the first electrode 131 (more specifically, the first pad portion 133) and the second electrode 132 (more specifically, the second pad portion 134) of the light-emitting device 52 are connected to each other by the plating layer 73. In the region in which the plating layer 73 should not be formed, it only needs to form a resist mask layer in advance as necessary.

Alternatively, an ultraviolet curable adhesive layer is coated on the first surface 10A (specifically, the first surface 10A including above the driving semiconductor device mounting portion 21 and the light-emitting device mounting portion 22) of the glass substrate 10. Further, by placing each of the electronic parts 52 and 60 on the ultraviolet curable adhesive and then applying ultraviolet rays from the second surface side of the glass substrate 10, the ultraviolet curable adhesive is cured to fix the electronic parts 52 and 60 on the first surface 10A (specifically, the driving semiconductor device mounting portion 21 and the light-emitting device mounting portion 22) of the glass substrate 10. Subsequently, after removing the uncured ultraviolet curable adhesive, the first wiring portion 20 and the electronic parts 52 and 60 are connected to each other by the plating layer 73 on the basis of an electrolytic copper plating method. Specifically, the driving semiconductor device mounting portion 21 and the connection terminal portion of the driving semiconductor apparatus 60 are connected to each other by the plating layer 73 on the basis of an electrolytic copper plating method. Further, the light-emitting device mounting portion 22 and the first electrode 131 (more specifically, the first pad portion 133) and the second electrode 132 (more specifically, the second pad portion 134) of the light-emitting device 52 are connected to each other by the plating layer 73. In the region in which the plating layer 73 should not be formed, it only needs to form a resist mask layer in advance as necessary. Note that after that, the cured ultraviolet curable adhesive may be removed.

Hereinafter, the step of mounting the electronic parts 52 and 60 on the first wiring portion 20 will be described.

[Step-200]

First, after forming an underlayer, the second compound semiconductor layer 122, the active layer 123, and the first compound semiconductor layer 121 on the light-emitting device production substrate 210 by using a well-known method, the first electrode 131 is formed on the first compound semiconductor layer 121 by using a well-known method and then patterned. Further, although depending on the structure of the light-emitting device, the second electrode 132 is formed. In this way, a product in progress of the light-emitting device shown in FIG. 3A can be obtained. Hereinafter, the product in progress of the light-emitting device will be referred to as "light-emitting device 200" for convenience.

[Step-210]

Figure 8A:
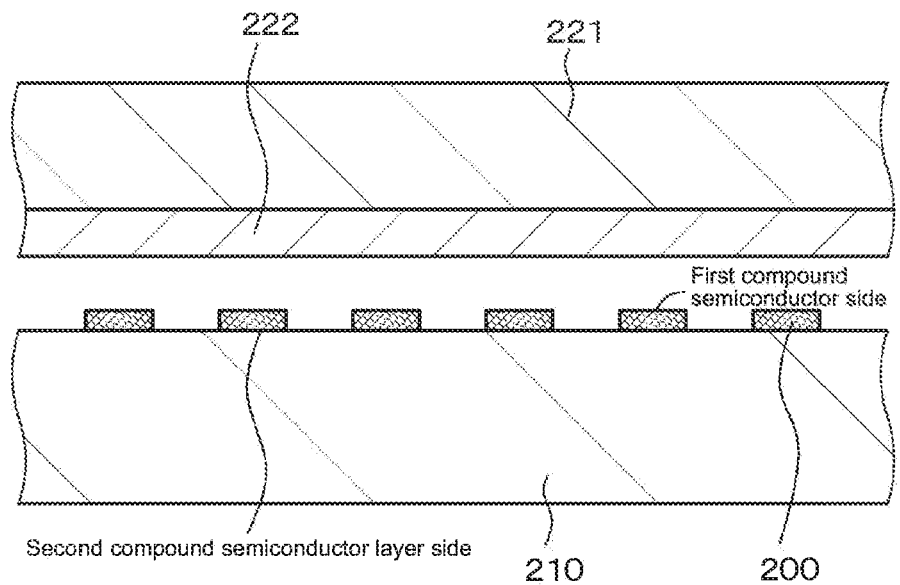
FIG. 8A and FIG. 8B are each a conceptual diagram showing a cross-section of the light-emitting device and the like for describing a method of mounting the light-emitting device in the embodiment 1.
Figure 8B:
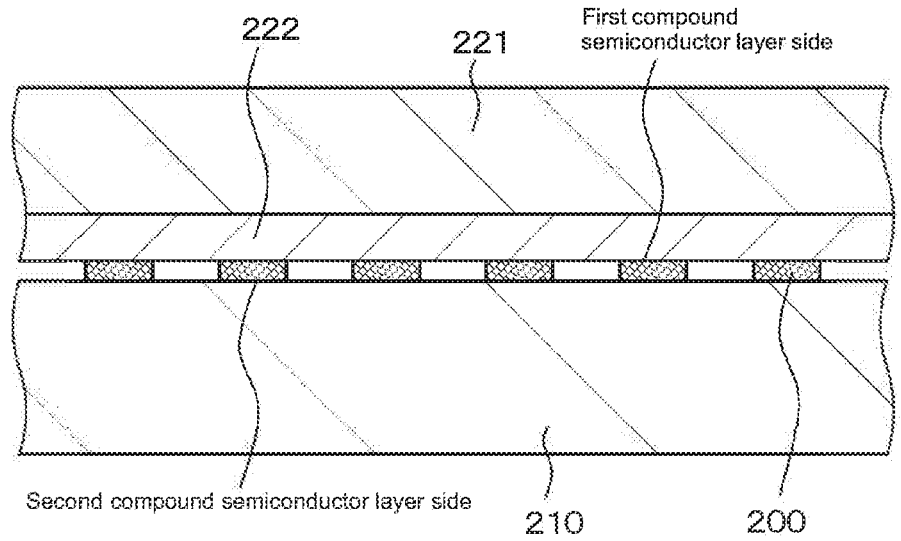

Subsequently, the light-emitting device is temporarily fixed to a first temporary fixation substrate 221 via the first electrode 131. Specifically, the first temporary fixation substrate 221 including a glass substrate is prepared, an adhesive layer 222 formed of an uncured adhesive being formed on the surface of the glass substrate. Further, by bonding the light-emitting device 200 and the adhesive layer 222 to each other and curing the adhesive layer 222, the light-emitting device 200 can be temporarily fixed to the first temporary fixation substrate 221 (see FIG. 8A and FIG. 8B).

[Step-220]

After that, the light-emitting device 200 is peeled off from the light-emitting device production substrate 210 (see FIG. 9A). Specifically, by thinning the light-emitting device production substrate 210 from the back surface thereof by lapping processing and then wet-etching the light-emitting device production substrate 210 and the underlayer, the light-emitting device production substrate 210 can be removed to expose the second compound semiconductor layer 122.

Note that examples of the material forming the first temporary fixation substrate 221 include a metal plate, an alloy plate, a ceramic plate, and a plastic plate in addition to a glass substrate. Examples of the method of temporarily fixing the light-emitting device to the first temporary fixation substrate 221 include a metal bonding method, a semiconductor bonding method, and a metal/semiconductor bonding method in addition to a method of using an adhesive. Further, examples of the method of removing the light-emitting device production substrate 210 and the like from the light-emitting device include a laser ablation method and a heating method in addition to an etching method.

[Step-230]

Next, although depending on the structure of the light-emitting device, the second electrode 132 is formed on the light output surface 122B of the exposed second compound semiconductor layer 122 on the basis of a so-called lift-off method. In this way, the light-emitting device 52 can be obtained.

[Step-240]

Figure 10A:
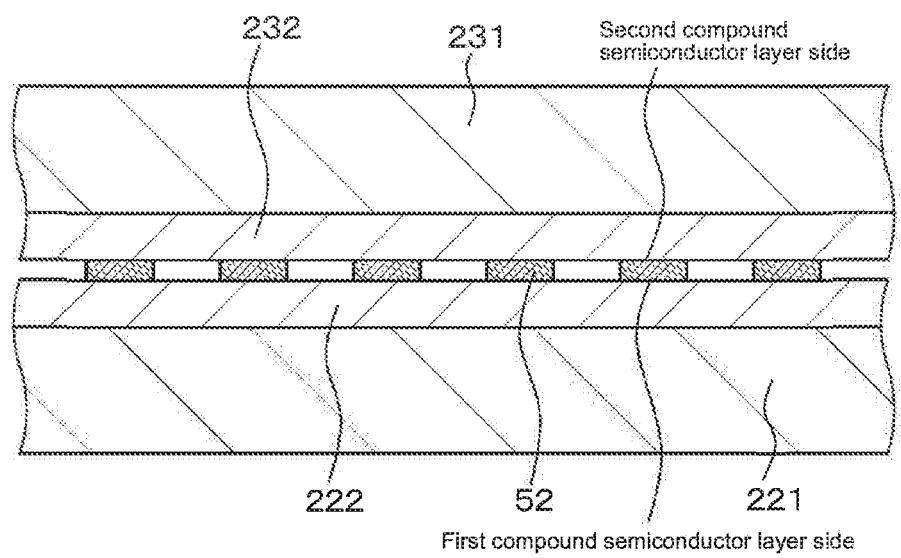
FIG. 10A and FIG. 10B are each a conceptual diagram showing the cross-section of the light-emitting device and the like for describing the method of mounting the light-emitting device in the embodiment 1, subsequently to FIG. 9B.
Figure 10B:
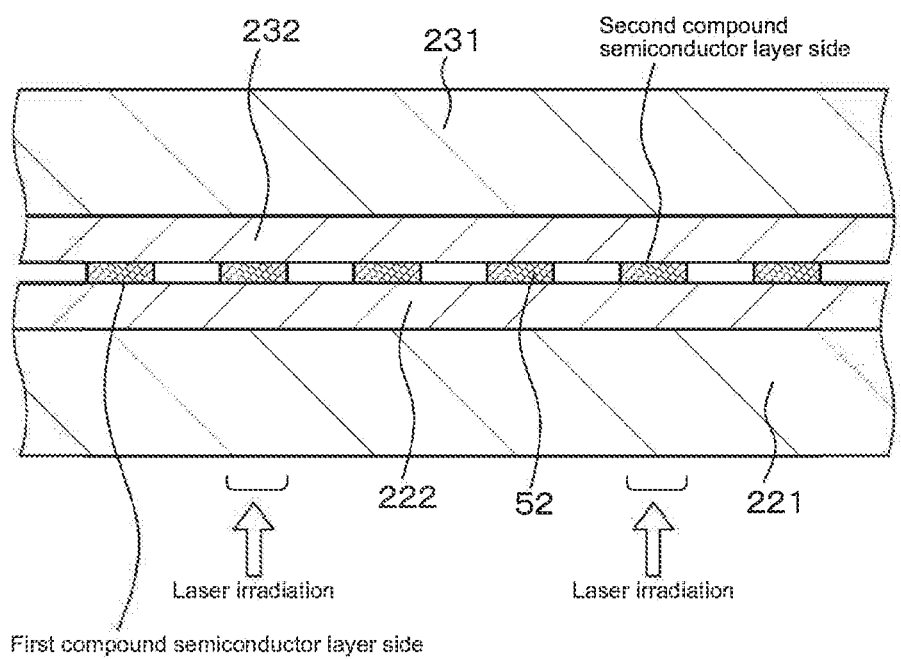
Figure 11A:
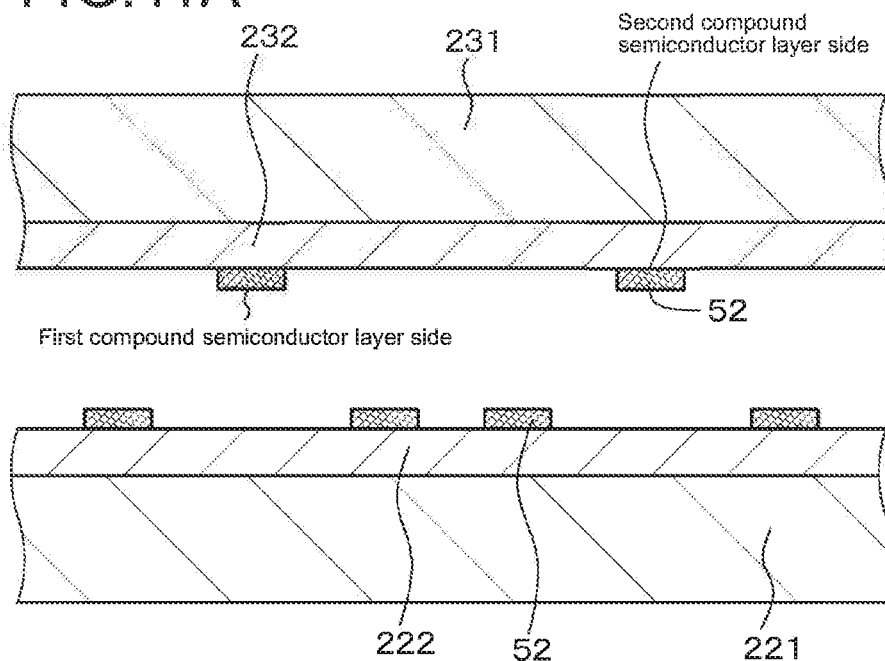
FIG. 11A and FIG. 11B are each a conceptual diagram showing the cross-section of the light-emitting device and the like for describing the method of mounting the light-emitting device in the embodiment 1, subsequently to FIG. 10B.

A second temporary fixation substrate 231 on which a weak adhesive layer 232 formed of silicone rubber is formed is prepared. Further, the weak adhesive layer 232 is pressed against the light-emitting devices 52 left in an array (in a two-dimensional matrix pattern) on the first temporary fixation substrate 221 (see FIG. 9B and FIG. 10A). Examples of the material forming the second temporary fixation substrate 231 include a glass plate, a metal plate, an alloy plate, a ceramic plate, a semiconductor substrate, and a plastic plate. Further, the second temporary fixation substrate 231 is held by a positioning apparatus (not shown). The positional relationship between the second temporary fixation substrate 231 and the first temporary fixation substrate 221 can be adjusted by the operation of the positioning apparatus. Subsequently, the light-emitting device 52 to be mounted (to be mounted on the glass substrate 10 is irradiated with, for example, an excimer laser from the back surface side of the first temporary fixation substrate 221 (see FIG. 10B). As a result, laser ablation occurs, and the light-emitting device 52 irradiated with an excimer laser is peeled off from the first temporary fixation substrate 221. After that, when the contact between the second temporary fixation substrate 231 and the light-emitting device 52 is released, the light-emitting device 52 peeled off from the first temporary fixation substrate 221 is adhered to the weak adhesive layer 232 (see FIG. 11A).

Figure 11B:
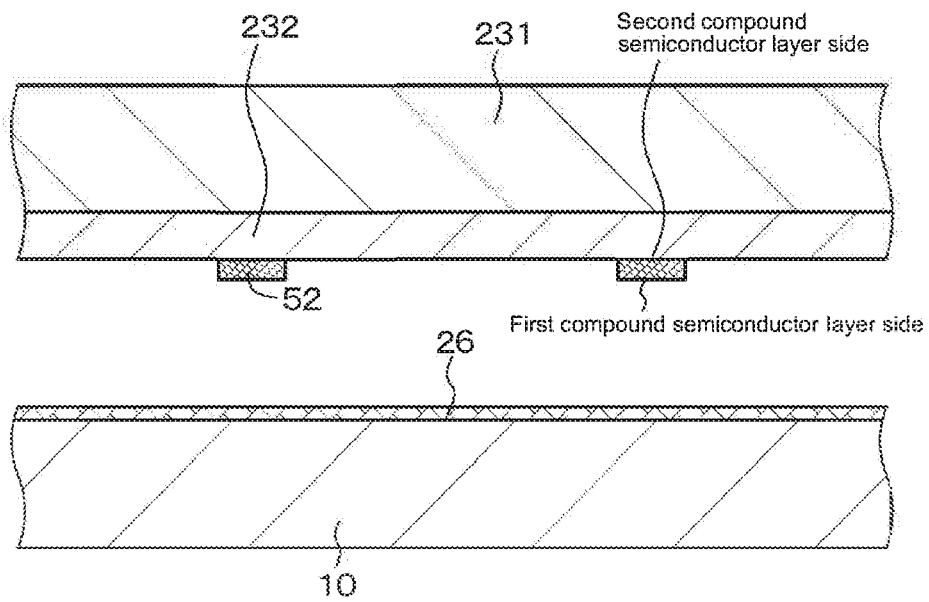

Subsequently, the light-emitting device 52 is placed on (moved on or transferred to) the thermosetting adhesive or ultraviolet curable adhesive layer described in [Step-140] (hereinafter, referred to as "adhesive layer 26") (see FIG. 11B). Note that the glass substrate 10 shown in FIG. 11B is shown by simplifying the configuration and structure of the glass substrate 10 shown in FIG. 1.

After that, it only needs to execute [Step-140] of the embodiment 1. Specifically, the light-emitting device 52 is placed, from the second temporary fixation substrate 231, on the adhesive layer 26 applied on the first surface side of the glass substrate 10A with an alignment mark formed on the first surface 10A of the glass substrate 10 as a reference. Since the light-emitting device 52 is weakly adhered to the weak adhesive layer 232, by moving the second temporary fixation substrate 231 in a direction away from the glass substrate 10 while the light-emitting device 52 is in contact with (pressed against) the adhesive layer 26, the light-emitting device 52 is left on the adhesive layer 26. Further, by deeply embedding the light-emitting device 52 into the adhesive layer 26 by using a roller or the like as necessary, the light-emitting device 52 can be mounted on the first surface 10A of the glass substrate 10.

Such a method using the second temporary fixation substrate 231 will be referred to as a step transfer method for the sake of convenience. Further, by repeating such a step transfer method a desired number of times, a desired number of light-emitting devices 52 are adhered to the weak adhesive layer 232 in a two-dimensional matrix pattern, and transferred onto the glass substrate 10. Specifically, for example, in one step transfer, 160×120 light-emitting devices 52 are adhered to the weak adhesive layer 232 in a two-dimensional matrix pattern, and transferred onto the glass substrate 10. Therefore, by repeating the step transfer method (1920×1080)/(160×120)=108 times, 1920×1080 light-emitting devices 52 can be transferred onto the glass substrate 10. Further, by repeating the above-mentioned step a total of three times, a predetermined number of red light-emitting devices 52R, green light-emitting devices 52G, and blue light-emitting devices 52B can be mounted on the glass substrate 10 at a predetermined interval and pitch.

As described above, in the glass wiring substrate, the method of producing the same, the part-mounted glass wiring substrate, the method of producing the same, and the display apparatus substrate of the embodiment 1, a through-hole having the diameter on a second surface side larger than the diameter on a first surface side is formed in a glass substrate, and a through-hole portion is formed in the through-hole. Therefore, it is possible to relatively easily form a through-hole portion having a high aspect ratio, which does not result in reduction in the productivity of the display apparatus substrate and the like. That is, it is possible to form a through-hole portion (through electrode) having a lower diameter on the first surface of the glass substrate, which is an active surface with a wiring having a fine design rule and low degree of freedom of mounting, and reliably form a through-hole portion (through electrode) between regions occupied by adjacent pixels. Further, since the first surface of the glass substrate is not directly irradiated with a laser at the time of the drilling processing using a laser, it is possible to prevent the first wiring portion formed on the first surface of the glass substrate from being damaged. Further, when filling the through-hole portion with the solder resist layer in [Step-130], since filling of the solder resist layer is performed from the second surface side of the glass substrate, the sliding surface of a squeegee of a screen printing apparatus is brought into contact with the second surface. Therefore, it is possible to prevent the first wiring portion formed on the first surface of the glass substrate from being damaged. Further, since a through-hole having the diameter on the second surface side larger than the diameter on the first surface side is formed, after the drilling processing using a laser, stress concentration when the glass substrate is thermally contracted is relaxed, and the connection reliability can be improved.

Figure 2:
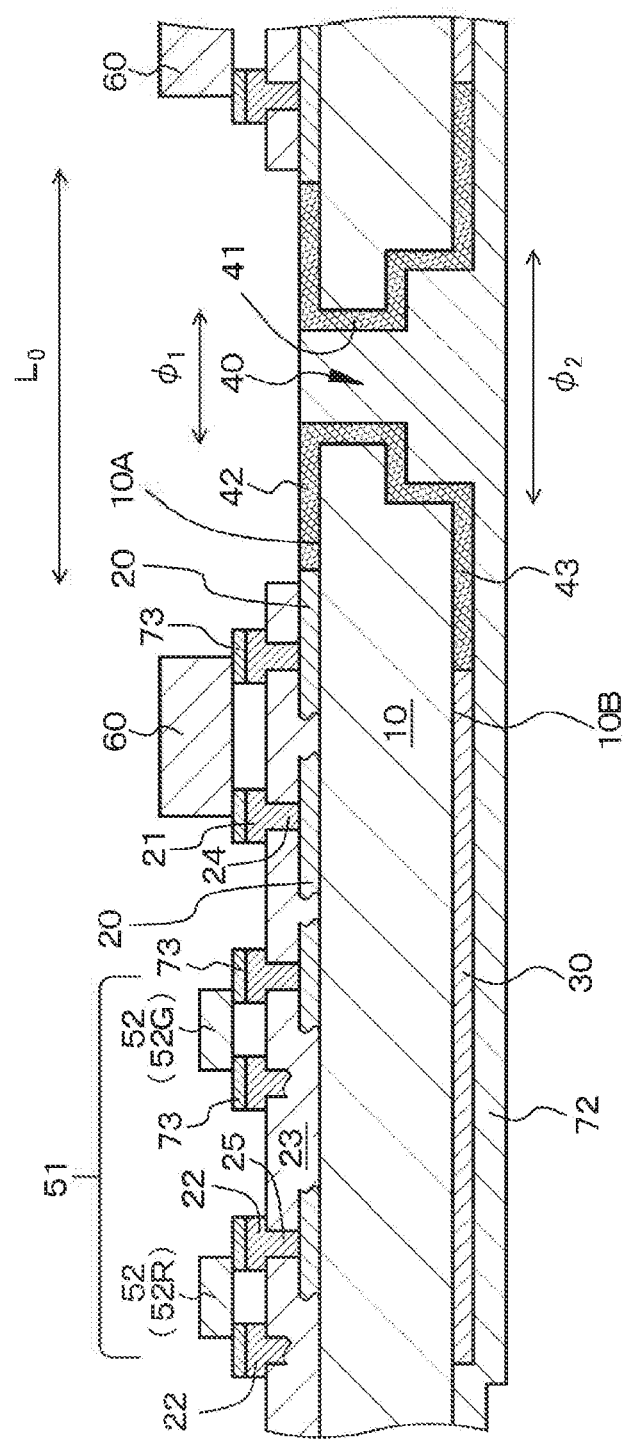
FIG. 2 is a schematic partial end view of a modified example of the glass wiring substrate, the part-mounted glass wiring substrate, and the display apparatus substrate of the embodiment 1.

Although the present disclosure has been described heretofore on the basis of favorable embodiments, the present disclosure is not limited to these embodiments. The configuration and structure of the glass wiring substrate, the part-mounted glass wiring substrate, the display apparatus substrate, and the light-emitting device described in the embodiments are examples, and also members and materials constituting them are examples and can be appropriately changed. Further, also the method of producing the glass wiring substrate and the method of producing the part-mounted glass wiring substrate are examples and can be appropriately changed. For example, the order of stacking the compound semiconductor layer in the light-emitting device may be reversed. As shown in a schematic partial end view of a modified example of the glass wiring substrate, the part-mounted glass wiring substrate, and the display apparatus substrate of the embodiment 1 in FIG. 2, the shape of the inner surface (inner wall) of the through-hole 40 in the glass substrate 10 can be a staircase shape.

A protective layer may be formed on the entire surface of the glass substrate 10 on the first surface side. Further, except for a part of the protective layer in which light is output from the light-emitting device, a light absorption layer may be formed on the protective layer.

Figure 4A:
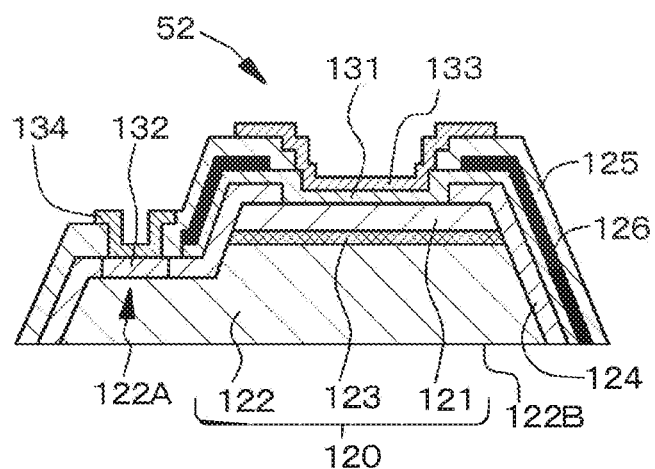
FIG. 4A and FIG. 4B are each a schematic partial end view of a modified example of the light-emitting device (light emitting diode) in the embodiment 1.
Figure 4B:
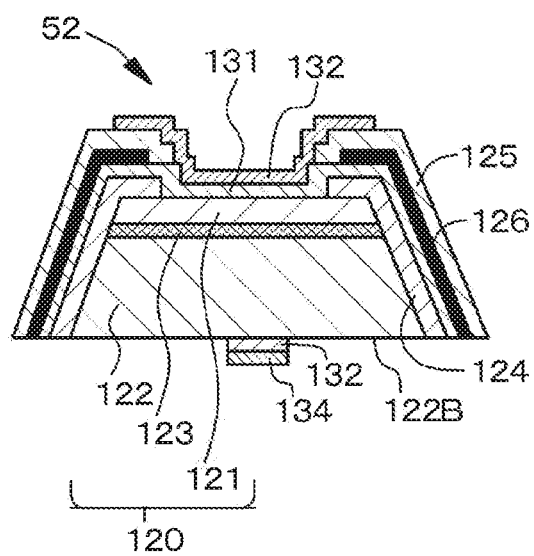

As shown in a modified example of the light-emitting device of the embodiment 1 in FIG. 4A or FIG. 4B, a light-shielding film 126 may be formed in a desired region (region close to the outer surface of the light-emitting device 52 in the illustrated example) of the light-emitting device 52 so that an undesired region is not irradiated with light output from the light-emitting device. Examples of the material forming the light-shielding film include a material capable of blocking light such as titanium (Ti), chromium (Cr), tungsten (W), tantalum (Ta), aluminum (Al), and $MoSi_2$.

As the light-emitting device constituting the light-emitting device unit, a fourth light-emitting device, a fifth light-emitting device, . . . may be added to a first light-emitting device, a second light-emitting device, and a third light-emitting device. Examples thereof include a light-emitting device unit to which a sub-pixel that emits white light is added to improve the luminance, a light-emitting device unit to which a sub-pixel that emits complementary color light is added to enlarge the color reproduction range, a light-emitting device unit to which a sub-pixel that emits yellow light is added to enlarge the color reproduction range, and a light-emitting device unit to which a sub-pixel that emits yellow light and cyan light is added to enlarge the color reproduction range.

Further, a tiling type display apparatus (light-emitting device display apparatus) in which a plurality of display apparatus substrates are arranged may also be used. Alternatively, the display apparatus substrate can be applied to a backlight, a lighting device, an advertisement medium, and the like using a light emitting diode.

The display apparatus (light-emitting device display apparatus) may be not only a flat type/direct view type image display apparatus of color display typified by a television receiver and a computer terminal but also an image display apparatus that projects an image on a retina of a human being and a projection type image display apparatus. Note that in these image display apparatuses, it only needs to, for example, adopt a field sequential driving method of displaying an image by controlling the light emission/non-light emission state of each of the first light-emitting device, the second light-emitting device, and the third light-emitting device in a time-division manner although the present disclosure is not limited thereto.

It should be noted that the present disclosure may take the following configurations.

[A01] «Method of Producing Glass Wiring Substrate»

A method of producing a glass wiring substrate, including:

preparing a glass substrate, a first wiring portion being formed on a first surface of the glass substrate, no wiring portion being formed on a second surface opposite to the first surface;

forming, in the glass substrate, a through-hole from a second surface side, the through-hole being in a region in which the first wiring portion is not formed, the through-hole having a diameter on the second surface side larger than a diameter on a first surface side; and then, forming a through-hole portion from inside of the through-hole to the first wiring portion, and forming, on the second surface, a second wiring portion extending from the through-hole portion.

[A02] The method of producing a glass wiring substrate according to [A01], further including:

forming the first wiring portion on the first surface of the glass substrate by forming a metal layer on the first surface of the glass substrate on the basis of a physical vapor deposition method and then patterning the metal layer; and forming the through-hole portion and the second wiring portion on the basis of a plating method.

[A03] The method of producing a glass wiring substrate according to [A01] or [A02], in which a wiring pitch $P_1$ of the first wiring portion in the vicinity of the through-hole portion is narrower than a wiring pitch $P_2$ of the second wiring portion in the vicinity of the through-hole portion.

[A04] The method of producing a glass wiring substrate according to [A03], in which a relationship of $P_2/P_1 \geq 10$ is satisfied.

[B01] «Method of Producing Part-Mounted Glass Wiring Substrate»

A method of producing a part-mounted glass wiring substrate, including:

preparing a glass substrate, a first wiring portion being formed on a first surface of the glass substrate, no wiring portion being formed on a second surface opposite to the first surface;

forming, in the glass substrate, a through-hole from a second surface side, the through-hole being in a region in which the first wiring portion is not formed, the through-hole having a diameter on the second surface side larger than a diameter on a first surface side; then, forming a through-hole portion from inside of the through-hole to the first wiring portion, and forming, on the second surface, a second wiring portion extending from the through-hole portion; and then, mounting an electronic part on the first wiring portion.

[B02] The method of producing a part-mounted glass wiring substrate according to [B01], in which the electronic part includes a plurality of light-emitting devices and a driving semiconductor apparatus driving the plurality of light-emitting devices, the driving semiconductor apparatus is mounted on a driving semiconductor device mounting portion provided on the first wiring portion, and connected from the driving semiconductor device mounting portion to the second wiring portion via the through-hole portion, and each of the plurality of light-emitting devices is mounted on a light-emitting device mounting portion provided on the first wiring portion, and connected to the driving semiconductor apparatus via the first wiring portion.

[B03] The method of producing a part-mounted glass wiring substrate according to [B02], in which the light-emitting device unit constitutes one pixel, and where a distance between regions occupied by adjacent pixels is represented by $L_0$ and a diameter of the through-hole on a first surface side is represented by $\varphi_1$, a relationship of $0.1 \leq \varphi_1/L_0 \leq 0.9$ is satisfied.

[B04] The method of producing a part-mounted glass wiring substrate according to [B03], further including:

forming the first wiring portion on the first surface of the glass substrate by forming a metal layer on the first surface of the glass substrate on the basis of a physical vapor deposition method and then patterning the metal layer; and forming the through-hole portion and the second wiring portion on the basis of a plating method.

[B05] The method of producing a part-mounted glass wiring substrate according to any one of [B01] to [B04], in which a wiring pitch $P_1$ of the first wiring portion in the vicinity of the through-hole portion is narrower than a wiring pitch $P_2$ of the second wiring portion in the vicinity of the through-hole portion.

[B06] The method of producing a part-mounted glass wiring substrate according to [B05], in which a relationship of $P_2/P_1 \geq 10$ is satisfied.

[C01] «Glass Wiring Substrate»

A glass wiring substrate, including:

a glass substrate, a first wiring portion being formed on a first surface of the glass substrate, a second wiring portion being formed on a second surface opposite to the first surface;

a through-hole formed in a region of the glass substrate in which the first wiring portion and the second wiring portion are not formed, the through-hole having a diameter on a second surface side larger than a diameter on a first surface side; and a through-hole portion formed in the through-hole, one end portion of the through-hole portion extending to the first wiring portion, the other end portion of the through-hole portion extending to the second wiring portion, in which a wiring pitch $P_1$ of the first wiring portion in the vicinity of the through-hole portion is narrower than a wiring pitch $P_2$ of the second wiring portion in the vicinity of the through-hole portion.

[C02] The glass wiring substrate according to [C01], in which the second wiring portion and the through-hole portion are formed of the same material, and the first wiring portion is formed of a material different from a material forming the second wiring portion.

[C03] The glass wiring substrate according to [C01] or [C02], in which a relationship of $P_2/P_1 \geq 10$ is satisfied.

[D01] «Part-Mounted Glass Wiring Substrate»

A part-mounted glass wiring substrate, including:

a glass substrate, a first wiring portion being formed on a first surface of the glass substrate, a second wiring portion being formed on a second surface opposite to the first surface;

a through-hole formed in a region of the glass substrate in which the first wiring portion and the second wiring portion are not formed, the through-hole having a diameter on a second surface side larger than a diameter on a first surface side;

a through-hole portion formed in the through-hole, one end portion of the through-hole portion extending to the first wiring portion, the other end portion of the through-hole portion extending to the second wiring portion; and an electronic part mounted on the first wiring portion, in which a wiring pitch $P_1$ of the first wiring portion in the vicinity of the through-hole portion is narrower than a wiring pitch $P_2$ of the second wiring portion in the vicinity of the through-hole portion.

[D02] The part-mounted glass wiring substrate according to [D01], in which the electronic part includes a plurality of light-emitting devices and a driving semiconductor apparatus driving the plurality of light-emitting devices, the driving semiconductor apparatus is mounted on a driving semiconductor device mounting portion provided on the first wiring portion, and connected from the driving semiconductor device mounting portion to the second wiring portion via the through-hole portion, and each of the plurality of light-emitting devices is mounted on a light-emitting device mounting portion provided on the first wiring portion, and connected to the driving semiconductor apparatus via the first wiring portion.

[D03] The part-mounted glass wiring substrate according to [D02] in which the light-emitting device unit constitutes one pixel, and where a distance between regions occupied by adjacent pixels is represented by $L_0$ and a diameter of the through-hole on a first surface side is represented by (pi, a relationship of $0.1 \le \varphi_1/L_0 \le 0.9$ is satisfied.

[D04] The part-mounted glass wiring substrate according to any one of [D01] to [D03], in which the second wiring portion and the through-hole portion are formed of the same material, and the first wiring portion is formed of a material different from a material forming the second wiring portion.

[D05] The part-mounted glass wiring substrate according to any one of [D01] to [D04], in which a relationship of $P_2/P_1 \ge 10$ is satisfied.

[E01] «Display Apparatus Substrate»

A display apparatus substrate, including:

a glass substrate, a first wiring portion being formed on a first surface of the glass substrate, a second wiring portion being formed on a second surface opposite to the first surface;

a through-hole formed in a region of the glass substrate in which the first wiring portion and the second wiring portion are not formed, the through-hole having a diameter on a second surface side larger than a diameter on a first surface side;

a through-hole portion formed in the through-hole, one end portion of the through-hole portion extending to the first wiring portion, the other end portion of the through-hole portion extending to the second wiring portion; and an electronic part mounted on the first wiring portion, in which a wiring pitch $P_1$ of the first wiring portion in the vicinity of the through-hole portion is narrower than a wiring pitch $P_2$ of the second wiring portion in the vicinity of the through-hole portion, the electronic part includes a plurality of light-emitting devices and a driving semiconductor apparatus driving the plurality of light-emitting devices, the driving semiconductor apparatus is mounted on a driving semiconductor device mounting portion provided on the first wiring portion, and connected from the driving semiconductor device mounting portion to the second wiring portion via the through-hole portion, and each of the plurality of light-emitting devices is mounted on a light-emitting device mounting portion provided on the first wiring portion, and connected to the driving semiconductor apparatus via the first wiring portion.

REFERENCE SIGNS LIST 10 glass substrate
10A first surface of glass substrate
10B second surface of glass substrate
20 first wiring portion
21 driving semiconductor device mounting portion
22 light-emitting device mounting portion
23 insulating layer
24, 25 contact hole
26 adhesive layer
30 second wiring portion
40 through-hole
41 through-hole portion
42 one end portion of through-hole portion
43 other end portion of through-hole portion
51 light-emitting device unit
52, 52R, 52G, 52B electronic part (light-emitting device)
60 electronic part (driving semiconductor apparatus)
71 seed layer
72 solder resist layer
73 plating layer
120 light-emitting layer
121 first compound semiconductor layer
122 second compound semiconductor layer
1228 light output surface
123 active layer
124 first insulating film
125 second insulating film
126 light-shielding film
131 first electrode
132 second electrode
133, 134 pad portion
200 light-emitting device
210 light-emitting device production substrate
221 first temporary fixation substrate
222 adhesive layer
231 second temporary fixation substrate
232 weak adhesive layer

The invention claimed is:

1. A glass wiring substrate, comprising:
a glass substrate;
a first wiring portion on a first surface of the glass substrate, wherein
  the first wiring portion is in contact with the glass substrate, and
  the first wiring portion comprises a first material;
a second wiring portion on a second surface of the glass substrate, wherein
  the second wiring portion comprises a second material,
  the second surface is opposite to the first surface, and
  the first material of the first wiring portion is different from the second material of the second wiring portion;
a through-hole in a first region of the glass substrate, wherein
  a second region of the glass substrate comprises the first wiring portion and the second wiring portion,
  the first region is different from the second region of the glass substrate,
  the through-hole has a first diameter on a side of the first surface, the through-hole has a second diameter on a side of the second surface, and the second diameter is larger than the first diameter;

a through-hole portion in the through-hole, wherein a first end portion of the through-hole portion extends to the first wiring portion, and a second end portion of the through-hole portion extends to the second wiring portion;

a solder resist layer inside the through-hole portion, wherein the second wiring portion is covered with the solder resist layer;

a plurality of light-emitting devices;

a plurality of driving semiconductor device mounting portions on the second region of the glass substrate, wherein the plurality of driving semiconductor device mounting portions is in contact with the first wiring portion on the second region; and a driving semiconductor apparatus on the plurality of driving semiconductor device mounting portions, wherein the driving semiconductor apparatus is configured to drive the plurality of light-emitting devices.

2. The glass wiring substrate according to claim 1, wherein the through-hole portion comprises a third material, and the second material of the second wiring portion is same as the third material of the through-hole portion.

3. The glass wiring substrate according to claim 1, wherein the first material is aluminum and the second material is copper.

4. A part-mounted glass wiring substrate, comprising:

a glass substrate;

a first wiring portion on a first surface of the glass substrate, wherein the first wiring portion is in contact with the glass substrate, and the first wiring portion comprises a first material;

a second wiring portion on a second surface of the glass substrate, wherein the second wiring portion comprises a second material, the second surface is opposite to the first surface, and the first material of the first wiring portion is different from the second material of the second wiring portion;

a through-hole in a first region of the glass substrate, wherein a second region of the glass substrate comprises the first wiring portion and the second wiring portion, the first region is different from the second region of the glass substrate, the through-hole has a first diameter on a side of the first surface, the through-hole has a second diameter on a side of the second surface, and the second diameter is larger than the first diameter;

a through-hole portion in the through-hole, wherein a first end portion of the through-hole portion extends to the first wiring portion, and a second end portion of the through-hole portion extends to the second wiring portion;

a solder resist layer inside the through-hole portion, wherein the second wiring portion is covered with the solder resist layer; and an electronic part on the first wiring portion, wherein the electronic part comprises:

a plurality of light-emitting devices;

a plurality of driving semiconductor device mounting portions on the second region of the glass substrate, wherein the plurality of driving semiconductor device mounting portions is in contact with the first wiring portion on the second region; and a driving semiconductor apparatus on the plurality of driving semiconductor device mounting portions, wherein the driving semiconductor apparatus is configured to drive the plurality of light-emitting devices, wherein the driving semiconductor apparatus is connected to the second wiring portion via the plurality of driving semiconductor device mounting portions and the through-hole portion.

5. The part-mounted glass wiring substrate according to claim 4, wherein each of the plurality of light-emitting devices is on a respective light-emitting device mounting portion, the respective light-emitting device mounting portion of each of the plurality of light-emitting devices is on the first wiring portion, and each of the plurality of light-emitting devices is connected to the driving semiconductor apparatus via the first wiring portion.

6. The part-mounted glass wiring substrate according to claim 5, further comprising a light-emitting device unit that constitutes a first pixel, wherein a distance between a region associated with the first pixel and a region associated with a second pixel is L0, the first pixel is adjacent to the second pixel, the first diameter of the through-hole is $\varphi 1$, and $0.1 \leq \varphi 1 / L0 \leq 0.9$.

7. The part-mounted glass wiring substrate according to claim 4, wherein the through-hole portion comprises a third material, and the second material of the second wiring portion is same as the third material of the through-hole portion.

8. A display apparatus substrate, comprising:

a glass substrate;

a first wiring portion on a first surface of the glass substrate, wherein the first wiring portion comprises a first material;

a second wiring portion on a second surface of the glass substrate, wherein the second wiring portion comprises a second material, the second surface is opposite to the first surface, and the first material of the first wiring portion is different from the second material of the second wiring portion;

a through-hole in a first region of the glass substrate, wherein a second region of the glass substrate comprises the first wiring portion and the second wiring portion, the first region is different from the second region of the glass substrate, the through-hole has a first diameter on a side of the first surface, the through-hole has a second diameter on a side of the second surface, and
the second diameter is larger than the first diameter;
a through-hole portion in the through-hole, wherein
a first end portion of the through-hole portion extends to the first wiring portion,
a second end portion of the through-hole portion extends to the second wiring portion; and
an electronic part on the first wiring portion, wherein
the electronic part includes:
a plurality of light-emitting devices; and
a driving semiconductor apparatus configured to drive the plurality of light-emitting devices,
the driving semiconductor apparatus is on a driving semiconductor device mounting portion,
the driving semiconductor device mounting portion is on the first wiring portion,
the driving semiconductor apparatus is connected to the second wiring portion via the driving semiconductor device mounting portion and the through-hole portion,
each of the plurality of light-emitting devices is on a corresponding light-emitting device mounting portion,
the corresponding light-emitting device mounting portion is on the first wiring portion, and
each of the plurality of light-emitting devices is connected to the driving semiconductor apparatus via the first wiring portion.

* * * * *